United States Patent [19]
Uchida et al.

[11] Patent Number: 5,863,379
[45] Date of Patent: Jan. 26, 1999

[54] MULTILAYER FILM FORMING APPARATUS AND FILM FORMING METHOD

[75] Inventors: Shinji Uchida; Tsuguhiro Korenaga, both of Neyagawa; Hideo Kurokawa; Akito Sawada, both of Kantano, all of Japan

[73] Assignee: Matsushita Electric Industrial Co., Ltd., Osaka, Japan

[21] Appl. No.: 275,273

[22] Filed: Jul. 15, 1994

[30]  Foreign Application Priority Data

Jul. 15, 1993  [JP]  Japan ................................. 5-175423

[51] Int. Cl.⁶ ..................................................... B32B 31/00
[52] U.S. Cl. ............................ 156/378; 156/60; 156/182; 156/230; 156/247; 350/164; 350/175
[58] Field of Search ................................. 65/60; 356/108, 356/161; 209/82; 250/559, 560; 350/164, 175; 156/60, 82, 247, 330, 324, 378, 538

[56]  References Cited

U.S. PATENT DOCUMENTS

| | | |
|---|---|---|
| 3,892,490 | 7/1975 | Uetsuki et al. . |
| 5,425,964 | 6/1995 | Southwell et al. ........................ 427/10 |

FOREIGN PATENT DOCUMENTS

| | | |
|---|---|---|
| A-0 552 648 | 7/1993 | European Pat. Off. . |
| 27 50 421 | 5/1979 | Germany . |
| 51-035679 | 3/1976 | Japan . |
| 78040189 | 10/1978 | Japan . |
| 1-259175 | 10/1989 | Japan . |

OTHER PUBLICATIONS

M. Oshikri et al., *Optical Thickness Monitoring in Dielectric Multilayer Deposition for Surface–Emitting Laser Reflectors,* Electronics and Communications in Japan 75 (1992): No. 12, p. 12.

*Primary Examiner*—Merrick Dixon
*Attorney, Agent, or Firm*—Morrison & Foerster

[57]  ABSTRACT

A multilayer film forming apparatus including a film forming chamber, a substrate on which a multilayer film is formed, an optical thickness monitoring substrate which controls an optical thickness of each layer of a multilayer film, a monitor exchange system which exchanges the optical thickness monitoring substrate for each layer and a multilayer film monitoring substrate which is disposed under the optical thickness monitoring substrate to observe spectral characteristics of the multilayer film. The invention also includes a light source which irradiates light to the optical thickness monitoring substrate and to the multilayer film monitoring substrate, an optical lens which reshapes the light radiated from the light source, an optical window which lets the light into and out of the film forming chamber, a detector which detects the light quantity reflected from the optical thickness monitoring substrate and a spectral characteristics evaluation device which measures spectral characteristics of the light reflected from the multilayer film monitoring substrate. The multilayer film monitoring substrate is fixed to a holding jig to prevent itself from inclining more than ten minutes against the disposed state.

12 Claims, 20 Drawing Sheets

MULTILAYER FILM FORMING APPARATUS AND FILM FORMING METHOD

FIELD OF THE INVENTION

This invention relates to a multilayer film forming apparatus used in optical devices etc., and further relates to a method of forming the film.

BACKGROUND OF THE INVENTION

A multilayer film which is formed by laminating $TiO_2$, $SiO_2$ etc., is used e.g. for a color separation prism in video cameras. This film has the function of separating light coming from an object into light with specific wavelengths, such as red, blue, and green.

Recently, optical devices are required to show high performance so that they can keep pace with advanced electronics. This is especially true in terms of multilayer films used e.g. for a color separation prism which requires uniform thickness and quality.

There are two conventional methods used to control optical thickness when this kind of multilayer film is formed: a monochromatic photometric method and a dichroic photometric method. In the following, an example of the monochromatic photometric method is explained with reference to FIG. 22.

Film forming chamber 61 is kept in high vacuum condition through exhaust pump 60. EB (electron beam) gun 62 disposed in this chamber melts evaporation material 63 by heat. Evaporated particles 64 reach substrate 66 which is disposed on substrate holder 65 and form a film. At the same time, after passing through hole 67 of substrate holder 65, evaporated particles 64 reach monitoring substrate 68 and form a film. Light radiated with a specific wavelength from light source 69 reaches the film formed on monitoring substrate 68, and reflected light quantity is detected at detector 70. Since the reflected light quantity changes according to the refraction index or thickness of the film formed on monitoring substrate 68, computer 71 reads the reflected light quantity while the film is being formed. As soon as the reflected light quantity reaches a predetermined value, shutter 72 closes and ends the evaporation process. In this way, the first layer is completed.

In the next phase, evaporation material 63 is replaced with another material, and monitoring substrate 68 is also replaced with a new substrate. The same process which took place in forming the first layer follows, i.e. EB gun 62 melts evaporation material 63 by heat, and the second layer is formed on substrate 66. By repeating this operation many times, a multilayer film having relatively uniform thicknesses is formed.

However, the above-mentioned conventional film forming method has the following problems.

Since light quantities reflected and transmitted from the film are used for this operation, it is extremely difficult to control with high accuracy of less than 0.5% due to light noise etc. from the light source and evaporation source. The quantities of reflected and transmitted light changed periodically according to optical thickness which was calculated from multiplying the refraction index by the thickness of a film. Accordingly, it was relatively easy to control the optical thickness by means of this periodicity. However, it is difficult to control the thickness with high accuracy since the thickness changes even if the optical thickness is constant. This happens when conditions, such as degree of vacuum or temperature, cause subtle changes, and the refraction index of the film changes accordingly.

In the past few years, the requirements for optical devices have become extremely rigid. Therefore, the optical thickness of the prior art material is not accurate enough, and a more accurate controlling method is desired. Furthermore, there was a major problem in quantity production. When a multilayer film consisting of tens of layers is formed, the entire products in the batch are no good if the thickness of one layer fails to be controlled for some reason.

SUMMARY OF THE INVENTION

It is an objective of this invention to solve the above-noted problems in conventional systems by providing an apparatus which can form multilayer films with high accuracy. This invention also provides a film forming method.

In order to accomplish these and other objects and advantages, a multilayer film forming apparatus of the invention comprises at least a film forming chamber which is kept at high vacuum condition ($10^{-5} \sim 10^{-6}$ torr), a substrate on which a multilayer film is formed, an optical thickness monitoring substrate which controls the optical thickness of each layer of a multilayer film, a monitor exchange system which exchanges the optical thickness monitoring substrate for each layer, a multilayer film monitoring substrate which is fixed to a holding jig to prevent itself from inclining more than a predetermined angle against the disposed state and observes spectral characteristics of the multilayer film, a light source which irradiates light to the optical thickness monitoring substrate and to the multilayer film monitoring substrate, an optical lens which reshapes the light radiated from the light source, an optical window which lets the light into and out of the film forming chamber, a controlling means which measures the light reflected and transmitted from the film formed on the optical thickness monitoring substrate and controls the optical thickness of the film of each layer, a measuring means which measures spectral characteristics of the light reflected and transmitted from the film formed on the multilayer film monitoring substrate, and a means for processing the results obtained by the measuring method and feeding them back to the thickness controlling means which controls the thickness of each layer and the optical thickness.

It is preferable in this embodiment of the invention that the predetermined angle be ten minutes.

It is preferable in this embodiment of the invention that the optical lens be achromatic. When an achromatic lens is used, the fixed angle of the monitoring substrate may be less than ten minutes. In this invention, ten minutes indicate $\frac{1}{6}$ degree since one degree is sixty minutes.

According to a multilayer film forming method of a second embodiment of this invention, spectral characteristics of an L-layer film formed on a multilayer film monitoring substrate are measured when a multilayer film is formed up to the L-layer, a gap between the measured value and the target value is calculated, the thickness or refraction index of the film following the L-layer is recalculated in order to reduce the gap by changing a predetermined value, the thickness or refraction index of the L+1 film obtained through the above-noted calculation process is fed back to a thickness controlling means or a refraction index controlling means to form the L+1 layer, and the thickness or refraction index of the L+1 layer L+1 is calculated by means of a predetermined adjustment formula based on the gap.

It is preferable in this embodiment of the invention that a wavelength gap at half maximum of spectral characteristics be used as the gap.

Furthermore, it is preferable in this embodiment that the adjustment formula is a function between the wavelength gap at half maximum and a constant.

Furthermore, it is preferable in this embodiment that the adjustment formula is a function between the wavelength gap at half maximum and a coefficient weighted to each layer. In this instance, it is preferable that the film be formed while observing the spectral characteristics of the multilayer film, in particular, observing the transmitted index or reflectance of a specific wavelength of the spectral characteristics.

According to a film forming method of a third embodiment of the invention, a multilayer film is formed until the thickness of a specific layer or an optical thickness reaches a predetermined value. The remaining layers are formed while measuring spectral characteristics of the multilayer film until the above-noted spectral characteristics reach predetermined spectral characteristics.

Furthermore, it is preferable in this third embodiment that a multilayer film consisting of N-layers is formed by forming the first layer to the N–1 layer until the thickness or the optical thickness of each layer reaches the predetermined value and forming the N-layer while measuring the spectral characteristics of the multilayer film until the spectral characteristics reach the predetermined spectral characteristics.

Furthermore, it is preferable in the second or third embodiments that a light beam be irradiated to an optical thickness monitoring substrate having less than ten minutes of parallelization degree and to a multilayer film monitoring substrate disposed below. The beam is preferably separated into a first beam (1) which is either reflected or transmitted at the optical thickness monitoring substrate and a second beam (2) which is either reflected or transmitted at the multilayer film monitoring substrate, beam 1 being used to measure the reflected or transmitted light quantity, while beam 2 is used to measure the spectral characteristics of the multilayer film.

Furthermore, it is preferable in the second or third embodiments of the invention that a beam be irradiated to an optical thickness monitoring substrate and a multilayer film monitoring substrate disposed below. The beam is preferably separated into a first beam (1) which is either reflected or transmitted at the optical thickness monitoring substrate and a second beam (2) which is either reflected or transmitted at the multilayer film monitoring substrate. Beam 1 is used to measure the reflected or transmitted light quantity, and beam 2 is used to measure the spectral characteristics of the multilayer film in a condition where the optical thickness monitoring substrate disposed on the multilayer film monitoring substrate is moved so that the optical thickness monitoring substrate is not present on the multilayer film monitoring substrate. It is preferable that the spectral characteristics of the multilayer film be measured by intercepting beam 2 in a position where the intercepted light quantity is not at the maximum value, in particular, beam 2 may be intercepted 2~8 mm away from a position where the intercepted light quantity reaches its maximum.

According to the first invention, a monolayer film controlling means through an optical thickness monitoring substrate is added to observe multilayer film characteristics on the spot through a multilayer film monitoring substrate in order to adjust the gap between each refraction index, each thickness etc. and the target value. Furthermore, the multilayer film monitoring substrate which observes the spectral characteristics of the multilayer film is fixed to a holding jig to prevent itself from inclining more than ten minutes from the disposed position so that it is possible to control the multilayer film substrate from changing its position when vibrations occur due to the exchange with the optical thickness monitoring substrate. As a result, the spectral characteristics can be evaluated more accurately.

Furthermore, it is preferable in the above-noted example that the optical lens be an achromatic lens so that the wavelength from the light source reaching the measurement means can be distributed evenly. Thus, the spectral characteristics can be evaluated even more accurately.

Furthermore, according to the film forming method of the second embodiment, it is not necessary to conduct a complicated optimizing calculation. A simple adjustment formula is enough to calculate adjustment values accurately and quickly. Therefore, calculation time can be reduced compared to the case where the gap is reduced by conducting an optimizing calculation. It is possible to attain a useful system in practice since a personal computer can be used as a calculator.

Furthermore, it is preferable in the above-noted example that the gap in the wavelength of spectral characteristics at half maximum be used as the gap quantity. The wavelength at half maximum functions as a parameter which determines the optical characteristics of the multilayer film and enables measurement with extremely high accuracy due to the fact that it is half the wavelength of maximum reflective light quantity so that it is hardly affected by subtle changes in measurement conditions.

Furthermore, it is preferable in the above-noted example that the adjustment formula be a function between the wavelength gap at half maximum and the constant. As a result, the optical characteristics according to the target value can be obtained.

Furthermore, it is preferable in the above-noted example that the formula be a function of the wavelength gap at half maximum and the coefficient weighted to each layer. As a result, the optical characteristics according to the target value can be approximately obtained even if the thickness of each layer of the multilayer film differs from the target value in the middle of film forming process. This is due to the fact that a change in the number of layers makes the degree of influence on the wavelength gap at half maximum totally different even if it is shifted at the same thickness when the thickness of each layer of the multilayer film differs from the target value in the middle of film forming process. However, the degree of influence on the wavelength gap at half maximum can be equalized almost completely by weighting according to the number of layers. In this instance, it is preferable that a film is formed while observing the spectral characteristics of the multilayer film, in particular, while observing the transmitted or reflected index of a specific wavelength of the spectral characteristics of the multilayer film. As a result, excellent optical characteristics can be obtain in a short time rather than comparing the measured value and the target value of the spectral characteristics at all wavelengths.

Furthermore, according to the film forming method of the third embodiment, a film is formed without being influenced by the optical thickness accuracy of a specific layer. As a result, it is possible to obtain a multilayer film having optical characteristics which are extremely close to the target characteristics.

Furthermore, it is preferable in the above-noted example that a multilayer film consisting of N-layers be formed by forming the first layer to the N–1 layer until the thickness or the optical thickness of each layer reaches the predetermined value and forming the N-layer while measuring the spectral characteristics of the multilayer film until the spectral characteristics reach the predetermined spectral characteristics. As a result, it is possible to form a multilayer film having optical characteristics which are extremely close to the target characteristics without being influenced by a gap in characteristics due to an error in optical thickness of the last layer even if the the optical thickness of the last layer created the error from the target thickness.

Furthermore, it is preferable in the second or third embodiments that a light beam be irradiated to an optical thickness monitoring substrate having less than ten minutes of parallelization degree and to a multilayer film monitoring substrate disposed below. The beam is preferably separated into a beam 1 which is either reflected or transmitted at the optical thickness monitoring substrate and to a beam 2 which is either reflected or transmitted at the multilayer film monitoring substrate. Beam 1 is used to measure the reflected or transmitted light quantity, while beam 2 is used to measure the spectral characteristics of the multilayer film. As a result, it is possible to improve the accuracy of the spectral characteristics evaluation since the fluctuation of the optical path is created by changes in parallelization degree of the optical thickness monitoring substrate.

Furthermore, it is preferable in the second or third embodiments that a beam be irradiated to an optical thickness monitoring substrate and a multilayer film monitoring substrate disposed below. The beam is separated into a beam 1 which is either reflected or transmitted at the optical thickness monitoring substrate and a beam 2 which is either reflected or transmitted at the multilayer film monitoring substrate. Beam 1 is used to measure the reflected or transmitted light quantity, and beam 2 is used to measure the spectral characteristics of the multilayer film in a condition where the optical thickness monitoring substrate disposed on the multilayer film minotoring substrate is moved so that the optical thickness monitoring substrate is not present on the multilayer film monitoring substrate. Accordingly, it is possible to create a condition which is not influenced by the optical thickness monitoring substrate when the spectral characteristics of the multilayer film are measured. As a result, it is possible to improve the accuracy of the spectral characteristics evaluation more since the fluctuation of the optical path is created by changes in parallelization degree of the optical thickness monitoring substrate. It is preferable in this example that the spectral characteristics of the multilayer film be measured by intercepting beam 2 in a position where the intercepted light quantity is not at the maximum value. As a result, it is possible to improve the accuracy of the spectral characteristics evaluation tremendously since the spectral characteristics of the multilayer film can be measured in a very stable area. In addition, it is preferable in this example that beam 2 is intercepted 2~8 mm away from the position where the intercepted light quantity reaches its maximum. As a result, the spectral characteristics of the multilayer film can be measured with extremely high accuracy.

DETAILED DESCRIPTION OF THE INVENTION

This invention is specifically described by referring to the following illustrative examples and attached figures.

EXAMPLE 1

Figure 1:
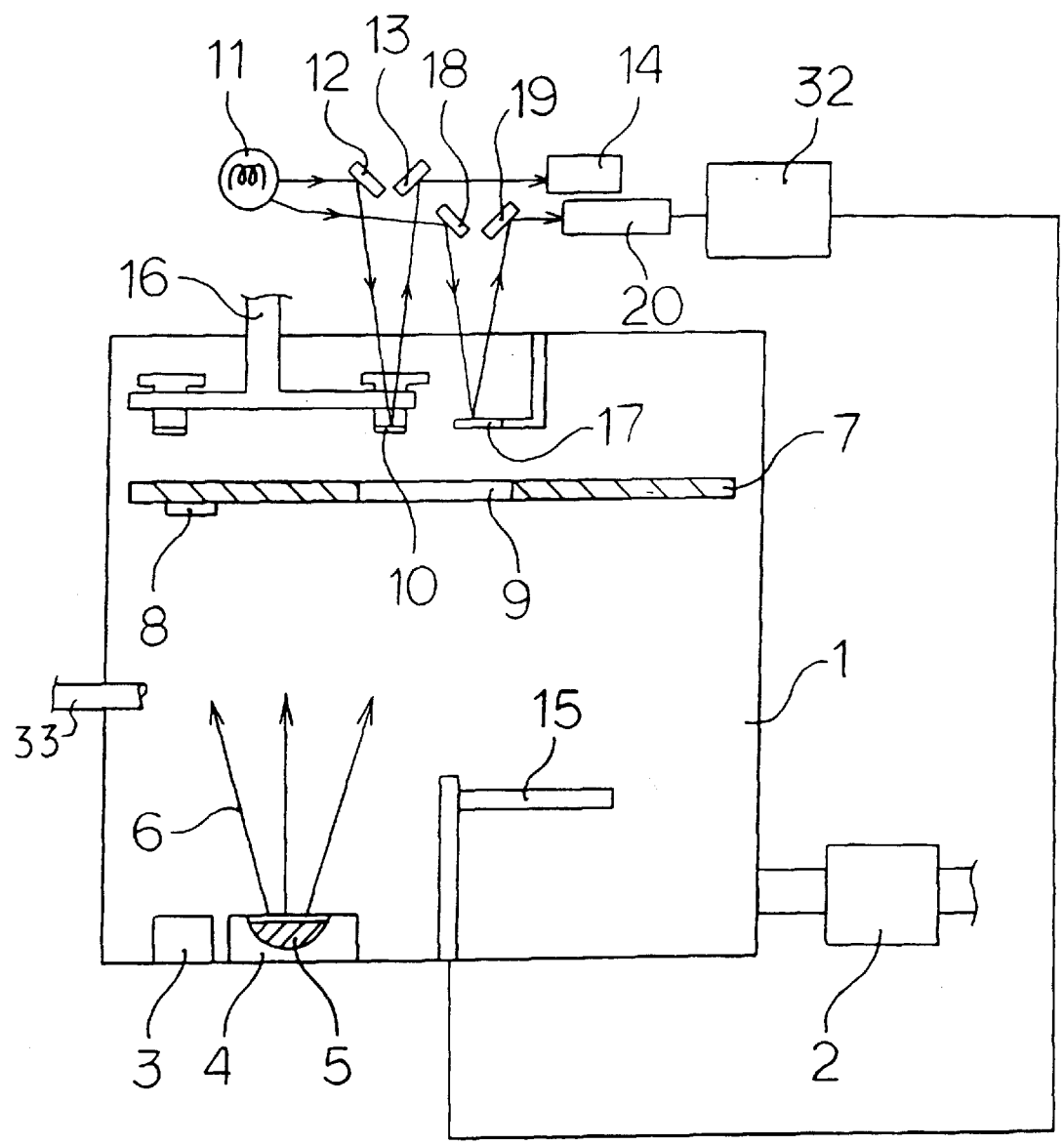
FIG. 1 is a cross-sectional view of a main part showing a multilayer film forming apparatus in one embodiment of the invention.

FIG. 1 is a cross-sectional view of a main part showing an embodiment of a multilayer film forming apparatus of the invention. In the following description, a multilayer film comprising $TiO_2$ and $SiO_2$ is formed by using an apparatus of this invention.

Film forming chamber 1 is kept at a high vacuum condition of $10^{-5}$~$10^{-6}$ Torr through exhaust pump 2. First, EB gun 3 melts and evaporates evaporation material ($TiO_2$) 5 in crucible 4 by heat. At this moment, oxygen gas is led in from gas inlet 33 and changes the degree of vacuum in film forming chamber 1 to 1~2×10−4 Torr. Evaporated particles 6 reach optical glass substrate 8 disposed on substrate holder 7 and form a film. At the same time, evaporated particles 6 which passed through hole 9 of substrate holder 7, reach optical thickness monitoring substrate 10 made of optical glass and form a film. Light radiated from light source 11 aims at this optical thickness monitoring substrate 10 via mirror 12, and the reflected light reaches detector 14 through mirror 13. Since the reflected light quantity changes according to the refraction index or thickness of the film formed on optical thickness monitoring substrate 10, computer 32 reads the quantity while the film is formed. As soon as the reflected light quantity reaches a predetermined value, shutter 15 closes and the first layer is completed. It is preferable that each substrate has a temperature between ordinary temperature to 360° C. during the evaporation process.

When the first layer is formed, evaporation material 5 in crucible 4 is replaced with $SiO_2$, and at the same time, a new piece of optical thickness monitoring substrate 10 is set by monitor exchange system 16. EB gun 3 melts $SiO_2$ by heat, and the evaporated particles fly to substrate 8. The second layer of film is formed. This film is also formed on optical thickness monitoring substrate 10, just as in the first layer. The reflected light quantity is detected at detector 14, and computer 32 reads this quantity while the film is formed. As soon as the reflected light quantity reaches a predetermined value, shutter 15 closes, and the second layer is completed.

Multilayer film monitoring substrate 17 made of optical glass is disposed beside optical thickness monitoring substrate 10 to observe spectral characteristics of a multilayer film on the spot. Unlike optical thickness monitoring substrate 10, this substrate remains in a specific position until all the films are completely formed. Therefore, a multilayer film formed on multilayer film monitoring substrate 17 is identical with the film formed on substrate 8 in number of layers and in thickness. In this way, the characteristics of the multilayer film formed on substrate 8 can be monitored by measuring the spectral characteristics of the multilayer film formed on multilayer film monitoring substrate 17. The spectral characteristics of the multilayer film formed on multilayer film monitoring substrate 17 can be obtained by leading a beam radiated from light source 11 through mirror 18 into multilayer film monitoring substrate 17, forwarding the reflected light through mirror 19 to spectral characteristics evaluation device 20, and measuring the spectral characteristics.

Figure 2:
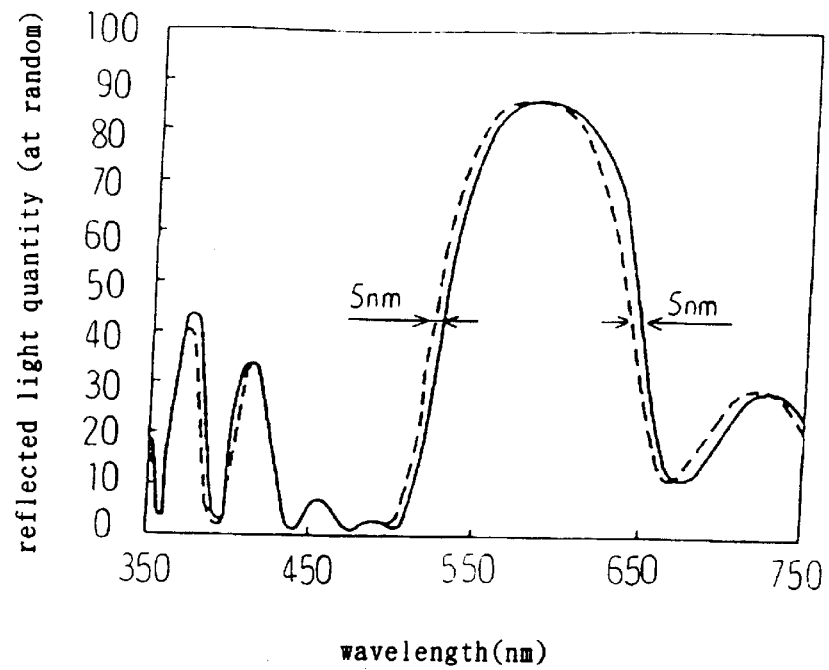
FIG. 2 is a graph of optical characteristics showing a multilayer film in which the characteristics are shifted.

When this operation is repeated e.g. ten times, a multilayer film consisting of ten layers will be formed. The broken line in FIG. 2 shows the spectral characteristics of the multilayer film obtained through this operation. The abscissa shows wavelength (nm) and the vertical axis shows any given reflected light quantity. According to the optical characteristics, the reflected light quantity reaches the maximum value when the wavelength is about 570 nm. Generally, this kind of multilayer film is called a dichroic film which can provide various colors by determining the maximum wavelength of the reflected light etc. at random. An accurate control of this wavelength position is important.

However, the refraction index or thickness of the laminated film is affected by subtle changes, such as errors caused by a thickness control or evaporation conditions etc. Thus, the target characteristics are more or less missed each time a film is formed. In fact, optical characteristics show a gap of ±5 nm due to the evaporation conditions.

Aiming at optical characteristics, a film was formed again under the same conditions in order to obtain the same optical characteristics. The full line in FIG. 2 shows the results of optical characteristics after forming ten layers. The results show that there is a gap between the two lines and the optical characteristics are different. When this gap is compared in quantity in terms of the wavelength at half maximum, i.e. the half value of wavelength of the maximum reflected light quantity which is generally most important for a dichroic film, it is shifted from the target characteristics on the long-wave side about 5 nm. Therefore, if a film continues to be formed by using the conventional monolayer film control only, the optical characteristics will have a larger gap with the target characteristics at the stage of completing the multilayer film consisting of nineteen layers. As a result, it is anticipated that the optical characteristics deteriorate. In order to make the spectral characteristics closer to the target characteristics, the spectral characteristics are measured before the nineteenth layer is formed, and the gap with the targeted spectral characteristics are adjusted by changing the following thicknesses and refraction indexes.

In the following example, an adjustment operation from the tenth layer is explained. First of all, when the tenth layer is formed, the reflected light quantity of each wavelength is measured by spectral characteristics evaluation device 20. This data is input into computer 32 which then calculates the gap with predetermined target characteristics of the tenth layer. In the next step, a combination of each thickness and refraction index is calculated in order to reduce the gap by changing the predetermined values of refraction index and thickness from the eleventh layer until the nineteenth layer. In this case, the DLS (Damped Least Squares) method, for example, is used to conduct an optimizing calculation, which is also used for designing lenses. The thickness and the refraction index obtained in this calculation are used as target values for forming the eleventh layer.

Figure 3:
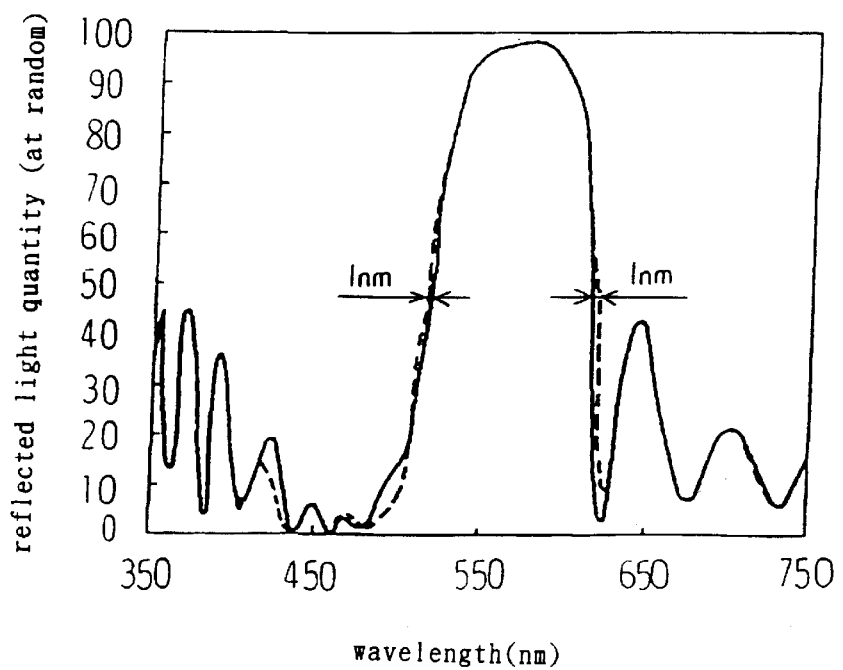
FIG. 3 is a graph of optical characteristics which were adjusted according to one embodiment of the multilayer film forming method in the invention.

This operation was repeated in sequence until the film consisting of nineteen layers was completed. The results of this operation are shown in FIG. 3 in which the unbroken line indicates the experimental value, and the dotted line indicates the target value. FIG. 3 shows that the target characteristics are approximately achieved with less than about 1 nm wavelength at half maximum. Thus, an extremely accurate multilayer film was formed.

Figure 4:
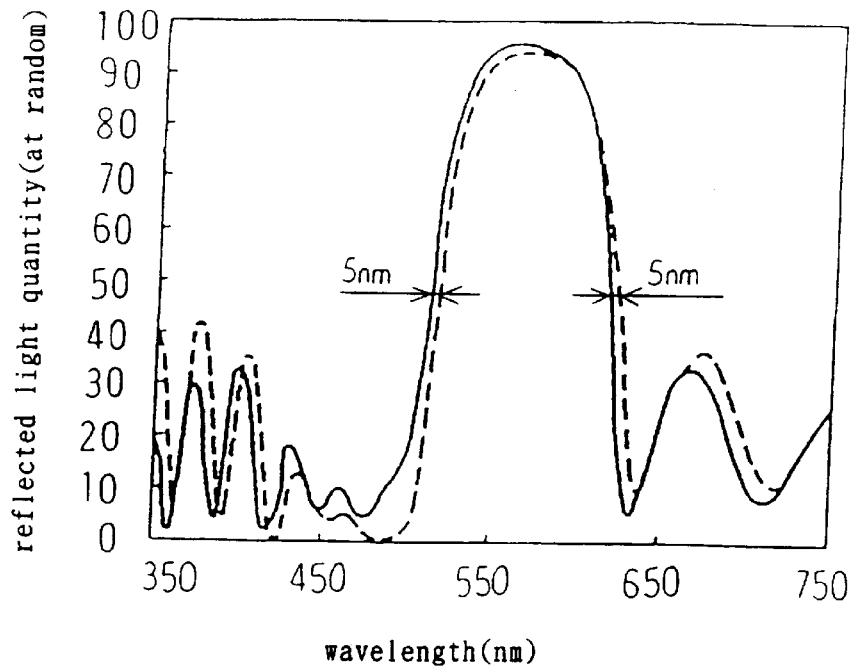
FIG. 4 is a graph of optical characteristics showing a multilayer film in which one layer showed a large thickness gap.

The next explanation refers to the case in which an unexpected accident occurs for some reason, e.g. the fourteenth layer of a nineteen-layer film is formed 10% thinner. FIG. 4 shows the results of measuring spectral characteristics of the fourteenth layer through multilayer film monitoring substrate 17 and spectral characteristics evaluation device 20 after the fourteenth layer was formed. In FIG. 4, the dotted line indicates the target value, and the unbroken line indicates measured value. The wavelength at half maximum measured in this way is shifted from the target value on the short-wave side about 5 nm. Therefore, it is anticipated that the optical characteristics of the multilayer film miss the target value to a large extent even if the following layers are formed according to the predetermined values.

Figure 5:
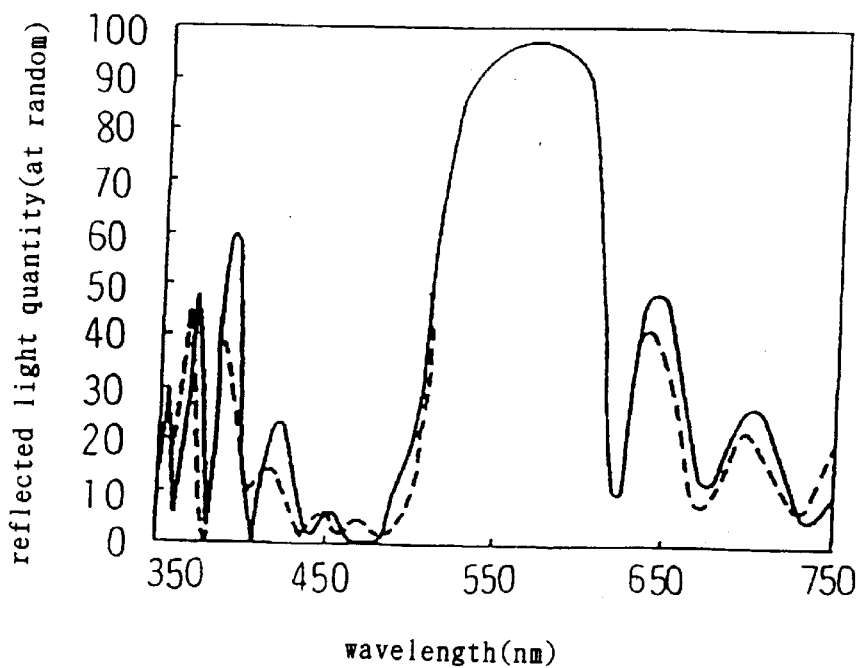
FIG. 5 is a graph of optical characteristics in which the thickness gap was adjusted according to one embodiment of the multilayer film forming method of the invention.

In order to reduce the gap of 5 nm, the thicknesses of the remaining layers, from the fifteenth to the nineteenth layer, were adjusted. The results of this operation are shown in FIG. 5 in which the measured value approaches the target value considerably, and the optical characteristics are recovered well. This method forms films by adjusting the optical characteristics to become closer to the target value even if a certain layer is formed in a totally different thickness due to an unexpected accident. As a result, this system is extremely useful for quantity production since excellent optical characteristics can be achieved.

In the first embodiment of this invention, a method of forming a multilayer film was described above in which the thickness was adjusted to obtain target characteristics. It is also possible to obtain the target characteristics by using other methods, for example, changing the evaporation material, changing the quantity of oxygen led into film forming chamber 1 from gas inlet 33, or changing the refraction index of the film by changing the film forming conditions, e.g. evaporation speed. Furthermore, the first embodiment referred to an example of measuring the reflected light quantity on multilayer film monitoring substrate 17, but the transmitted light quantity can also be used here. In addition, the first embodiment referred to an example of adjusting the thicknesses in the middle of multilayer film forming process, but there is no problem with conducting the adjustment from the first layer. Furthermore, in the first embodiment, an apparatus using a monochromatic photometric method was used to control monolayer films, but it is also possible to use an atomic absorption thickness monitor or a quartz crystal thickness monitor. However, even if various controlling methods can be used, monochromatic, dichroic or multicolor photometric methods achieved the most accurate multilayer film in which the reflected light from the monitoring substrate was used. As a result, this film forming apparatus is useful since it is equipped with a function of using this kind of photometric methods for controlling monolayer films.

EXAMPLE 2

According to the above-mentioned Example 1, a highly accurate multilayer film can be achieved easily with good reproducibility since the gap of each refraction index or each thickness can be adjusted to achieve the target value by providing a new function of observing the multilayer film during the film forming process in vacuum in addition to the conventional monolayer film controlling system.

However, there was a problem with this example. Since films are formed by revolving substrate holder 7, multilayer film monitoring substrate 17 can only be installed around the central part of substrate holder 7. In addition, multilayer film monitoring substrate 17 is disposed beside optical thickness monitoring substrate 10, so that the central part of substrate holder 7 is occupied with optical thickness monitoring substrate 10 and multilayer film monitoring substrate 17. As a result, the installation area of substrate 8 is reduced. This leads to a fall in production and presented a major problem for quantity production.

Furthermore, it is another major problem in practice to install a mirror separately in order to let the light enter multilayer film monitoring substrate 17 and to lead the reflected light into spectral characteristics evaluation device 20. In other words, an installation of the mirror would require in reality an accurate angle adjustment system or jigs to hold the mirror. In addition, it is also necessary to install a shading jig for preventing superfluous external light from entering the mirror. Thus, an extremely complicated optical system is needed for installing the multilayer film monitoring substrate. Furthermore, an installation of this optical system on top of film forming chamber 1 requires an area of considerable extent, but this is also a problem because there is scarcely space left due to monitor exchange system 16 etc disposed on top of the chamber.

In order to solve all these practical problems, the inventors et al. of the invention made various investigations and came up with the following example of the second embodiment.

Figure 6:
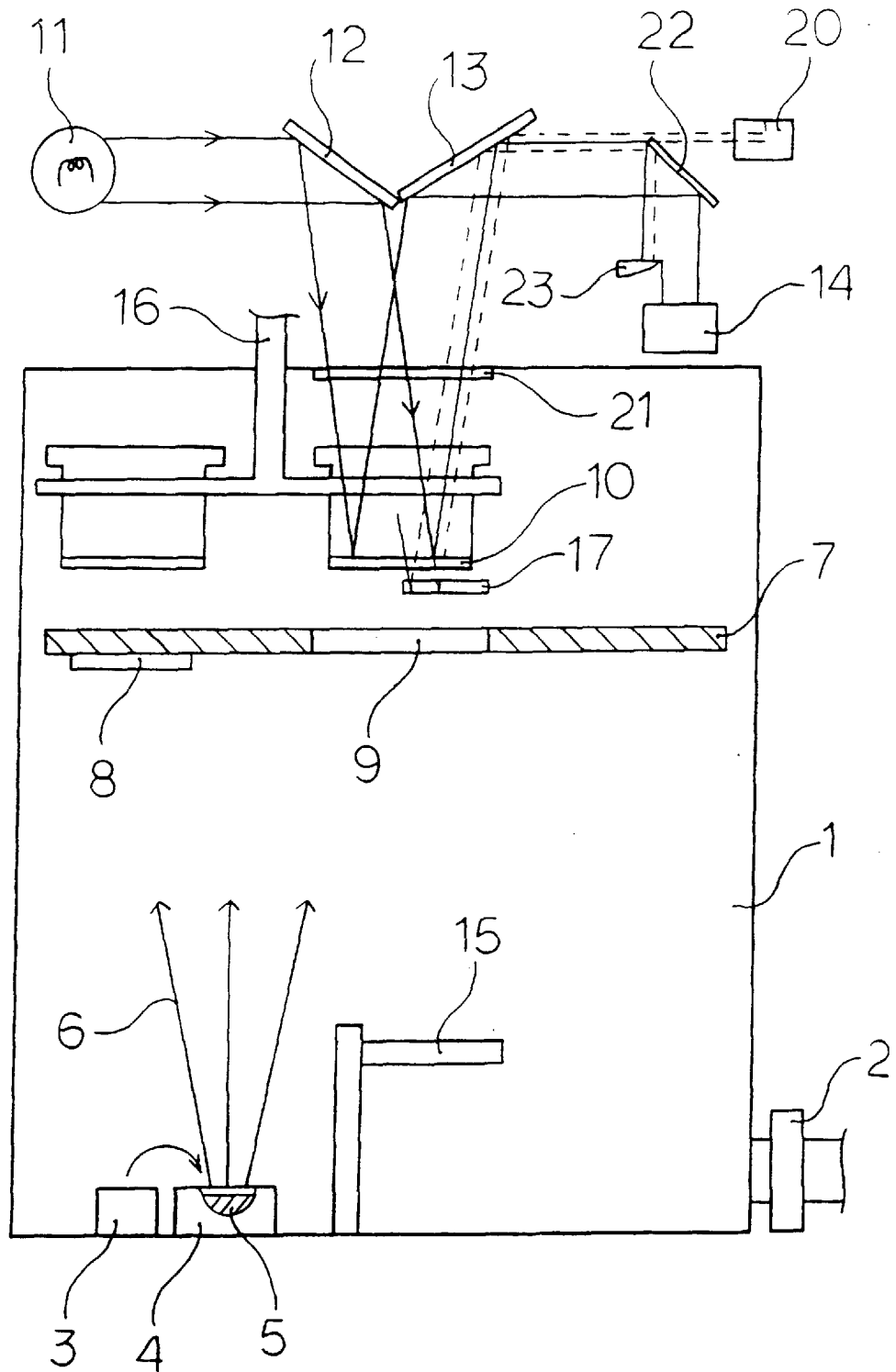
FIG. 6 is a cross-sectional view of a main part showing a film forming apparatus in another embodiment of the invention.
Figure 7A:
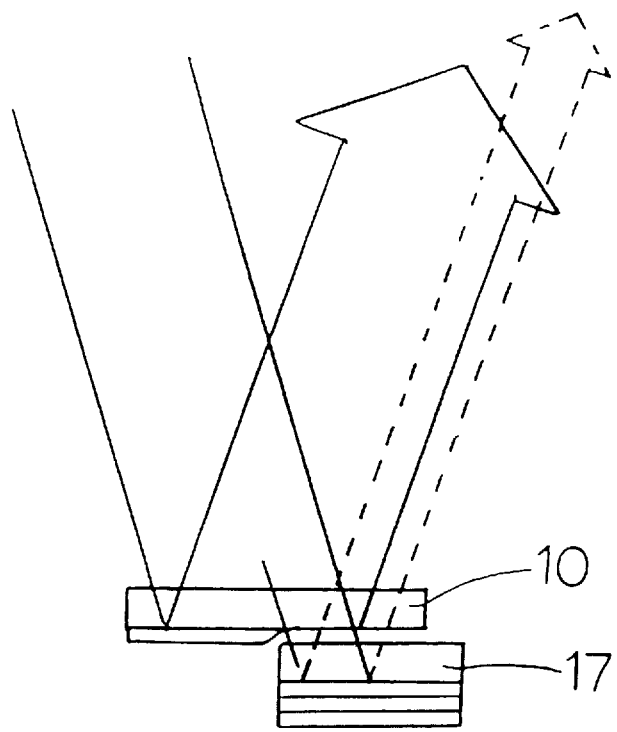
FIGS. 7A and 7B are outline views of an example showing a multilayer film monitoring substrate.
Figure 7B:
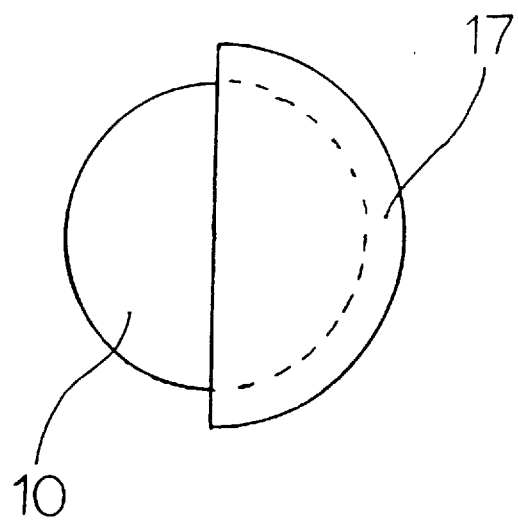

FIG. 6 is a cross-sectional view of the main part showing another embodiment of a multilayer film forming apparatus of the invention. FIG. 6 shows that the film forming apparatus of the second embodiment is different from the above-mentioned first embodiment in which multilayer film monitoring substrate 17 is disposed under optical thickness monitoring substrate 10. FIG. 7 shows that multilayer film monitoring substrate 17 comprising of an optical glass substrate in semicircular form is placed to cover about the half area of optical thickness monitoring substrate 10. FIG. 7 (A) is a side view of the optical glass substrate. FIG. 7 (B) is a view from underneath. The shape is not necessarily limited to this form, but any other shape, e.g. a rectangle, will also do.

A beam radiated from light source 11 reaches optical thickness monitoring substrate 10 through mirror 12 and optical window 21, and the reflected light reaches detector 14 through mirrors 13, 22. If any light other than the reflected light from optical thickness monitoring substrate 10 enters detector 14, it will not be possible to control the thickness with high accuracy. Therefore, shading plate 23 is provided to prevent the reflected light from multilayer film monitoring substrate 17 from entering detector 14.

As seen above, the beam radiated from light source 11 enters optical thickness monitoring substrate 10 through mirror 12, and a part of this beam reaches detector 14 by reflection. However, there is also light passing optical thickness monitoring substrate 10. The light passing optical thickness monitoring substrate 10 is reflected by an optical multilayer film formed on multilayer film monitoring substrate 17 and arrives at spectral characteristics evaluation device 20 through mirror 13. In this instance, mirror 22 intercepts the reflected light from optical thickness monitoring substrate 10 so that only the reflected light from multilayer film monitoring substrate 17 can be detected.

By disposing multilayer film monitoring substrate 17 under optical thickness monitoring substrate 10, it is not necessary to install a separate optical system to lead the light to multilayer film monitoring substrate 17 and to forward the reflected light to spectral characteristics evaluation device 20. Thus, a simply structured, low-cost film forming apparatus can be obtained. In addition, the central part of substrate holder 7 will not be occupied with multilayer film monitoring substrate 17 etc. so that there is sufficient installation area reserved for substrate 8. As a result, it is possible to improve production.

Figure 8:
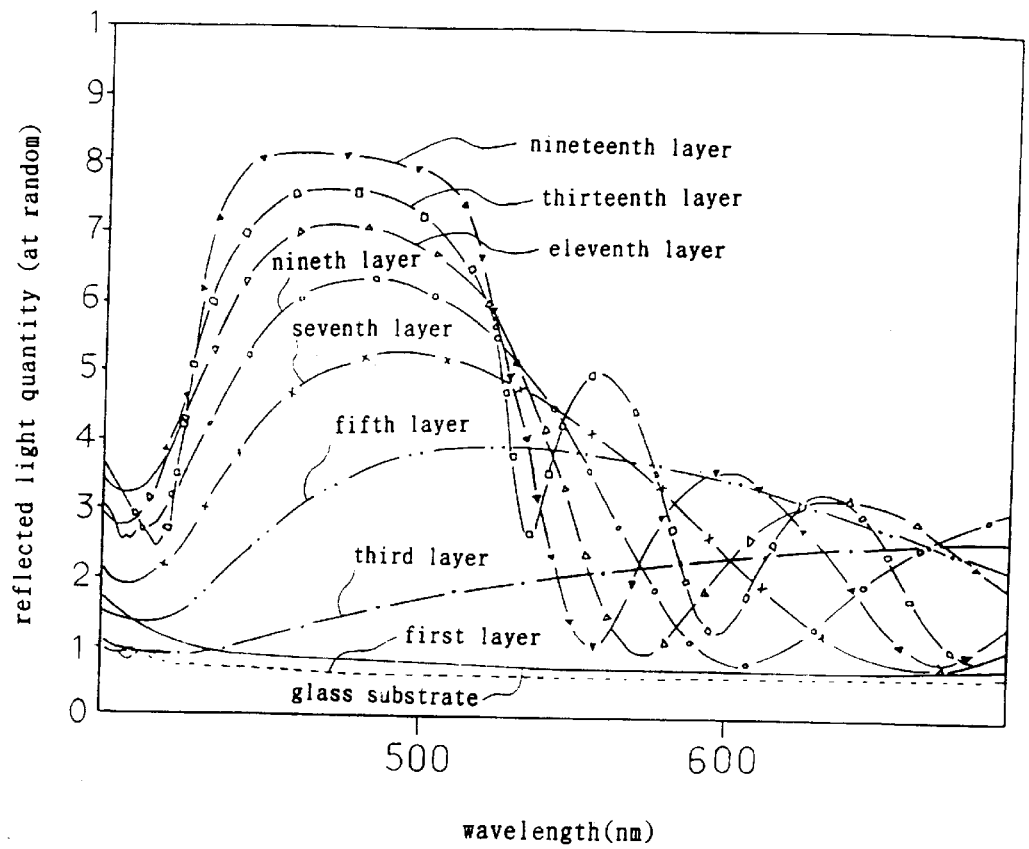
FIG. 8 is a graph of optical characteristics showing certain spectral characteristics in a multilayer film.

The film forming apparatus of the invention formed a nineteen-layer film in which $TiO_2$ film had a thickness of about 100 nm and $SiO_2$ film had a thickness of 40 nm while the optical thickness was controlled. Optical characteristics of the multilayer film formed on multilayer film monitoring substrate 17 was measured, and the results are shown in FIG. 8. The graph shows that the multilayer film with higher reflectance is obtained in proportion to the number of layers piled on. As a result, the above-noted example can easily attain an apparatus which can measure spectral characteristics of the multilayer film while the optical thickness is controlled.

EXAMPLE 3

An apparatus of the second embodiment was used to measure spectral characteristics of the multilayer film while the optical thickness was controlled. It became clear that not every multilayer film can be measured successfully due to low reflectance of the multilayer film. It became clear through investigation that this was due to a decrease of light quantity arriving at detector 14 or spectral characteristics evaluation device 20 by using mirror 22 and shading plate 23 in order to eliminate the overlapping part of the reflected light beams from multilayer film monitoring substrate 17 and optical thickness monitoring substrate 10. Another reason was the delicate adjustment failure of mirror 22 or shading plate 23. In other words, even if mirror 22 or shading plate 23 is adjusted according to the reflected light from an optical thickness monitoring substrate or a multilayer film monitoring substrate, when the reflected light from multilayer film monitoring substrate 17 or optical thickness monitoring substrate 10 inclines at the stage of forming the multilayer film, the reflected light from optical thickness monitoring substrate 10 can enter spectral characteristics evaluation device 20, and the reflected light from multilayer film monitoring substrate 17 can enter detector 14. As a result, the measurement was not conducted successfully.

Based on this fact, the third embodiment of the invention was figured out to solve the above-noted inconvenience by separating the light beams reflected from optical thickness monitoring substrate 10 and multilayer film monitoring substrate 17 without using mirror 22 or shading plate 23.

Figure 9A:
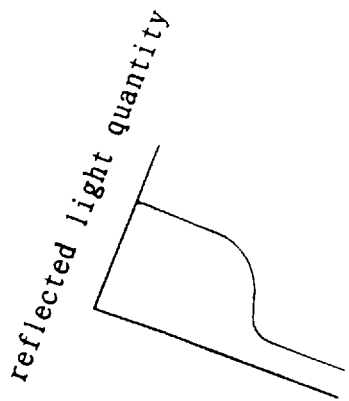
FIGS. 9A and 9B are outline views of a multilayer film monitoring substrate in an inclined state.
Figure 9B:
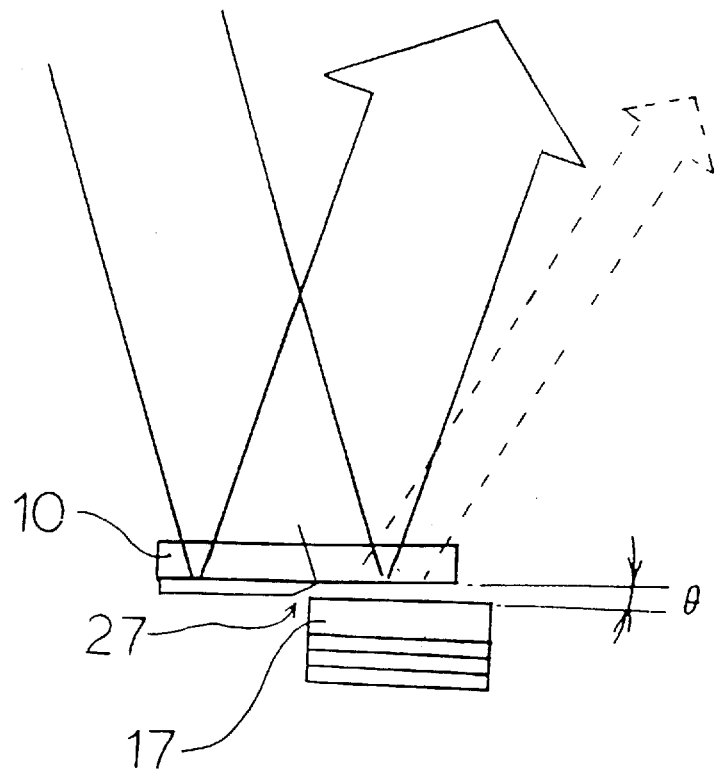

The outline is shown in FIG. 9. FIG. 9 (B) shows that multilayer film monitoring substrate 17 is inclined at an angle of θ against optical thickness monitoring substrate 10. In this way, a gap of angle is created between the light beams reflected from optical thickness monitoring substrate 10 and multilayer film monitoring substrate 17. Accordingly, an area can be created where the two reflected light beams do not overlap. As a result, when the light is measured separately in this area, the above-noted problem with mirror 22 or shading plate 23 in the second embodiment disappears so that the reflected light can be detected effectively.

Generally, spectral characteristics evaluation device 20 and detector 14 are disposed at a distance of about 100 cm away from each monitoring substrate. Therefore, when the inclined angle θ is 0.2 degrees, a beam distance of about 3 mm is created which is sufficient for the separating two light beams. When multilayer monitoring substrate 17 is inclined, there will be a gap between the thickness formed on optical thickness monitoring substrate 10 and the thickness formed on multilayer film monitoring substrate 17. However, when the angle θ is one degree, there will be almost no problem because this gap is less than 0.02%. As a result, the problem of separating the light reflected from optical thickness monitoring substrate 10 and multilayer film monitoring substrate 17 at zero angle can be solved easily by inclining the multilayer monitoring substrate at angle θ of 0.2 to one degree.

EXAMPLE 4

By using a film forming apparatus of the second embodiment, multilayer film characteristics were measured while optical thickness was controlled. The problem arose by simply disposing multilayer film monitoring substrate 17. In other words, the multilayer film was formed with an optical thickness which is far from target optical thickness although the film was formed with the same optical thickness. A multilayer film was formed without disposing multilayer film monitoring substrate 17, and the spectral characteristics obtained were evaluated. These characteristics are shown by curve 51 in FIG. 10. On the other hand, when a film was formed with multilayer film monitoring substrate 17 disposed, the spectral characteristics were largely shifted on the long-wave side as depicted in curve 52, although the film was formed with the same optical thickness.

The cause revealed through investigation was that the thickness of the film formed on optical thickness monitoring substrate 10 became extremely thin in part where the light was intercepted by multilayer film monitoring substrate 17. This is called "thickness sagging". It became clear that thickness sagging part 27 which was created by the shade of multilayer film monitoring substrate 17, was also irradiated, and therefore, the reflected light of thickness sagging part 27 was detected together with the reflected light of the formally predetermined thickness part. The distribution of the reflected light quantity is shown in FIG. 9 (A). The part away from multilayer film monitoring substrate 17 is constant, whereas thickness sagging part 27 shows unevenness. The part where it is totally in the shade of multilayer film monitoring substrate 17 is the reflectance of optical thickness monitoring substrate 10.

Based on this fact, the fourth embodiment of the invention was figured out in order to obtain a predetermined multilayer film with good reproducibility by controlling the optical thickness after intentionally obstructing the reflected light of thickness sagging part 27.

Figure 11:
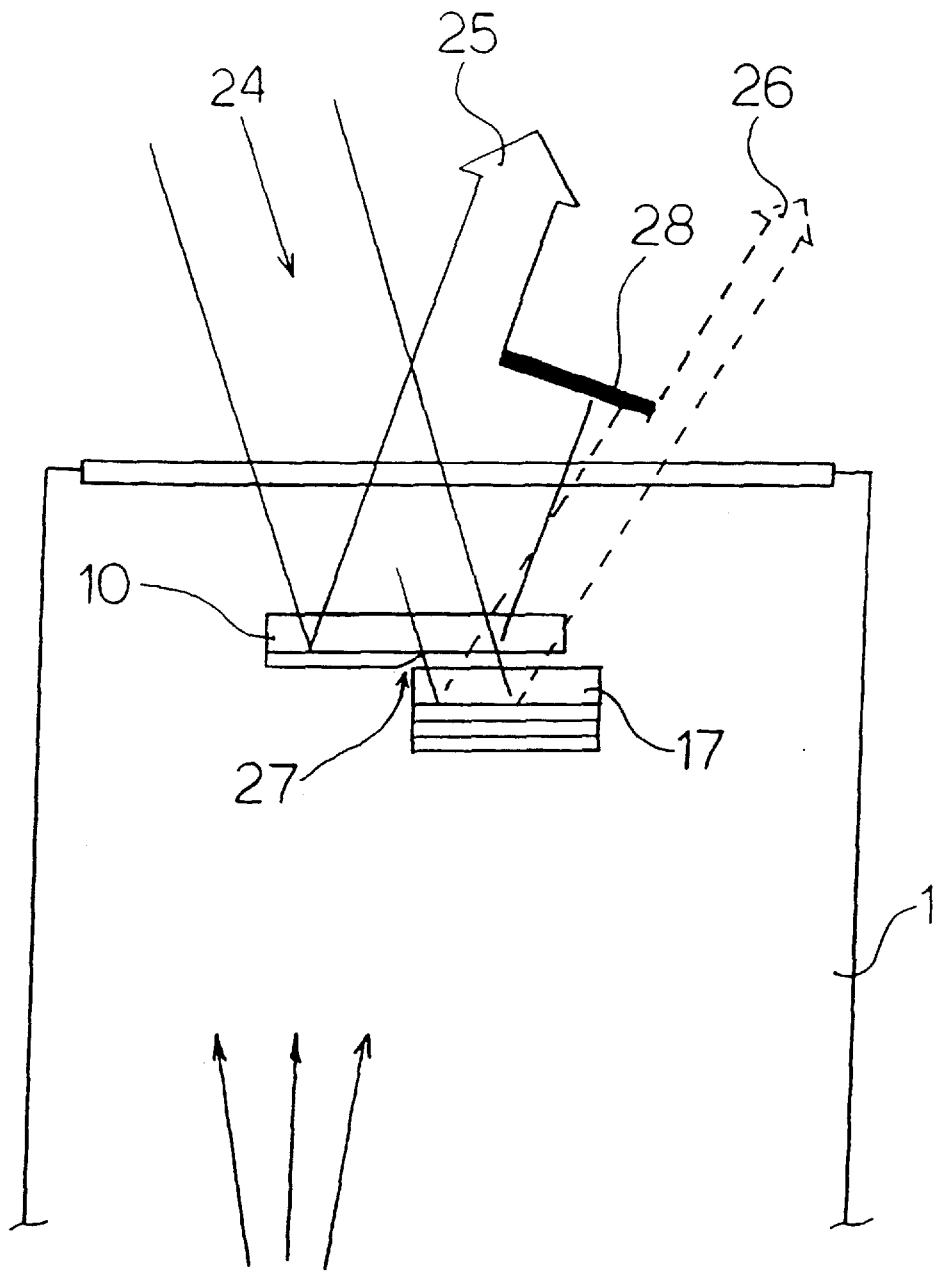
FIG. 11 is an outline view of an example showing a film forming apparatus equipped with a shading plate.

The concept view is shown in FIG. 11. FIG. 11 shows that optical thickness monitoring substrate 10 and multilayer film monitoring substrate 17 are disposed in film forming chamber 1. Light 24 is irradiated on each monitoring substrate, and the light reflects as reflected light 25 and reflected light 26. In order to obstruct the reflected light from thickness sagging part 27 of optical thickness monitoring substrate 10, shading plate 28 is disposed. This example intercepts superfluous light from thickness sagging part 27. High quality light is detected, and therefore, the predetermined multilayer film can be obtained with good reproducibility.

FIG. 11 also shows that not only reflected light 25 from optical thickness monitoring substrate 10 is obstructed by shading plate 28, but reflected light 26 from multilayer film monitoring substrate 17 is also obstructed. This is due to the fact that light passing thickness sagging part 27 overlaps with the reflected light of multilayer film monitoring substrate 17. The optical thickness can be controlled even better when the light passing thickness sagging part 27 is also obstructed.

Figure 10:
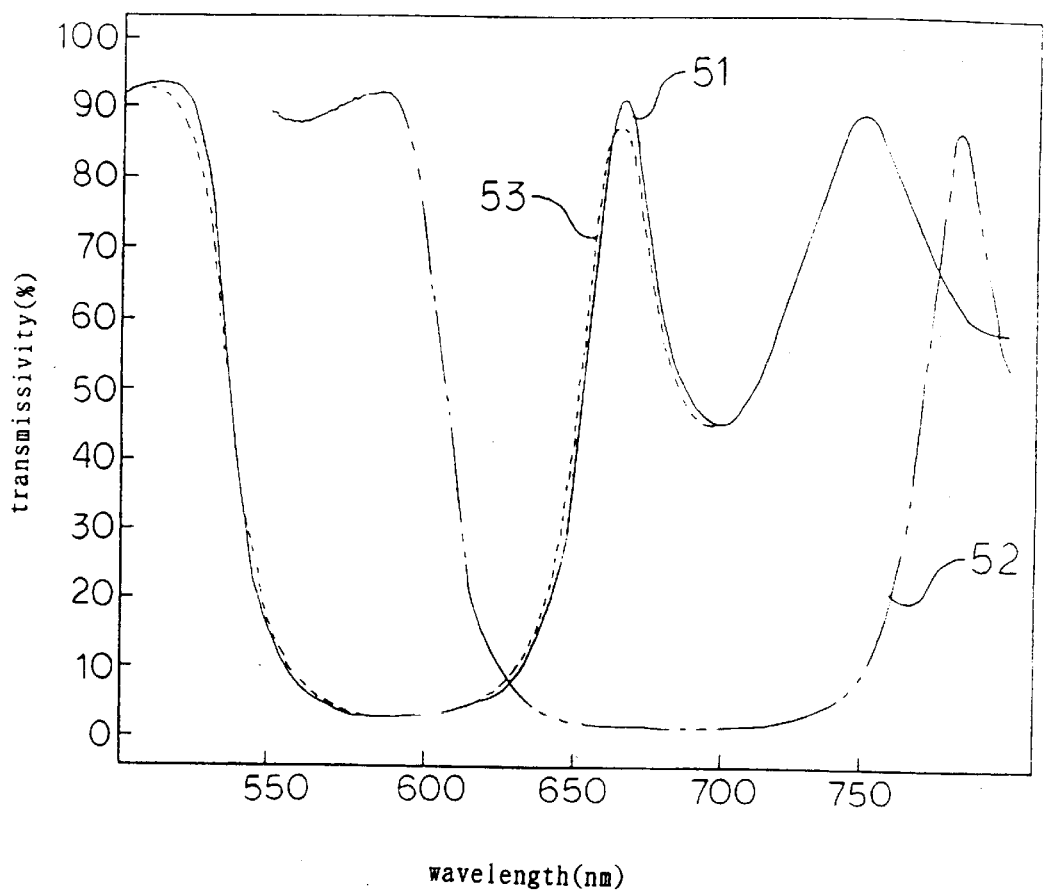
FIG. 10 is a graph of characteristics showing changes in optical characteristics.

The results of evaluating spectral characteristics are shown in FIG. 10 in which a multilayer film was formed by using an film forming apparatus of the fourth embodiment of the invention. While the apparatuses described in the first, second, and third embodiments showed property 52 which was shifted largely on the long-wave side. The property shown in curve 53 was obtained which is equal to the results (51) without having multilayer film monitoring substrate 17 (51). As a result, a multilayer film of the predetermined optical thickness was formed.

EXAMPLE 5

FIG. 11 shows a thickness sagging area which is formed on optical thickness monitoring substrate 10. A close observation of this area made clear that this area extends several mm from an end face of multilayer film monitoring substrate 17. The reason for this could be that evaporated particles intrude between multilayer film monitoring substrate 17 and optical thickness monitoring substrate 10 and adhere to optical thickness monitoring substrate 10. Therefore, the fifth embodiment of the invention was figured out to solve the above-noted inconvenience due to thickness sagging part 27 by preventing the evaporated particles to intrude in some way.

Figure 12:
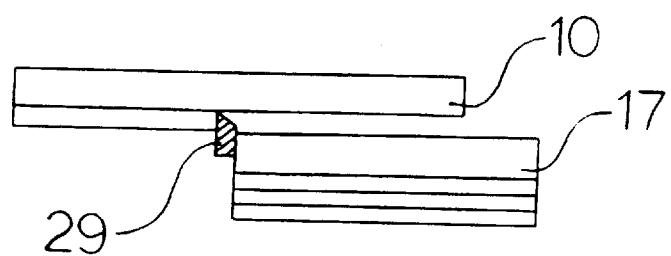
FIG. 12 is an outline view of an example with an adhesion-proof plate.

The outline is shown in FIG. 12. FIG. 12 shows that adhesion-proof plate 29 is disposed to prevent the evaporated particles from intruding between optical thickness monitoring substrate 10 and multilayer film monitoring substrate 17. Adhesion-proof plate 29 is disposed on the side face of multilayer film monitoring substrate 17 so that it does not interrupt the evaporated particles flying to multilayer film monitoring substrate 17 and optical thickness monitoring substrate 10. When the bottom of adhesion-proof plate 29 is located under the bottom of multilayer film monitoring substrate 17, adhesion-proof plate 29 affects multilayer film monitoring substrate 17 to create a thickness sagging to form on multilayer film monitoring substrate 17.

By using a multilayer film forming apparatus equipped with adhesion-proof plate 29, an optical thickness was controlled while multilayer film characteristics were observed. As a result, the multilayer film of the predetermined optical thickness was formed approximately.

EXAMPLE 6

When a multilayer film is formed, a substrate is sometimes heated to e.g. 200° C.~360° C. according to its use for the purpose of improving reliability and adhesive property of the film. However, a major problem arose when a multilayer film was formed at 200° C. using a film forming apparatus shown in FIG. 11. When the light reflected from optical thickness monitoring substrate 10 was detected as a signal at detector 14, the optical thickness was successfully controlled without hardly any noise at ordinary temperature, whereas the optical thickness was not successfully controlled at 200° C. due to too much noise within the signal.

Figure 13A:
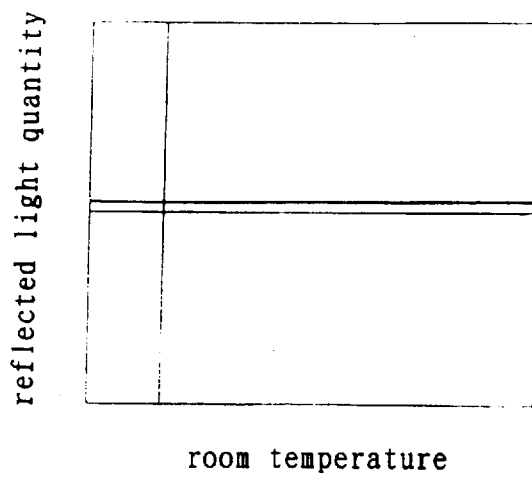
FIGS. 13A and 13B are graphs of characteristics showing the change in reflected light quantity over time.
Figure 13B:
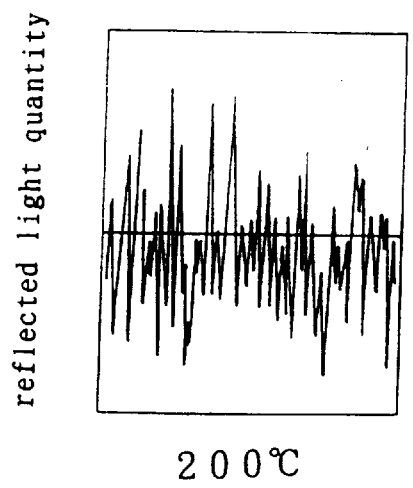

FIG. 13 shows the change in the reflected light quantity over time. According to FIG. 13 (A), there is almost no noise at room temperature, while noise increases considerably when the substrate temperature is raised to 200° C. (FIG. 13 (B)). The increase of noise is an extremely grave problem since it decreases the accuracy of the optical thickness control.

It became clear through investigation that this was due to the fact that the optical path is distorted because optical window 21 when highly heated heats the air above. According to FIG. 14 (A), reflected light 30 from the optical thickness monitoring substrate has light distribution 31. When this light is radiated from film forming chamber 1 through optical window 21 into atmosphere, the optical path is distorted when passing optical window 21 or film forming chamber 1 which are both relatively highly heated. Assuming that the light distribution shown by the unbroken line is distorted to the optical path shown in the dotted line, the light power detected at detector 14 changes drastically whether or not the optical path is distorted when the light is obstructed through shading plate 28 shown in FIG. 14 (A). In other words, FIG. 14 (A) shows that the light distribution area of the distorted optical path becomes broader than the actual light distribution area described by the unbroken line. It causes a phenomenon to occur in which the light quantity seems to change because of the distorted optical path even if light power 31 remains the same.

Based on this fact, the sixth embodiment of the present invention was figured out to prevent light power reaching detector 14 from changing by obstructing the light inside film forming chamber 1 which has no air even if the light distribution swings after radiated.

Figure 14:
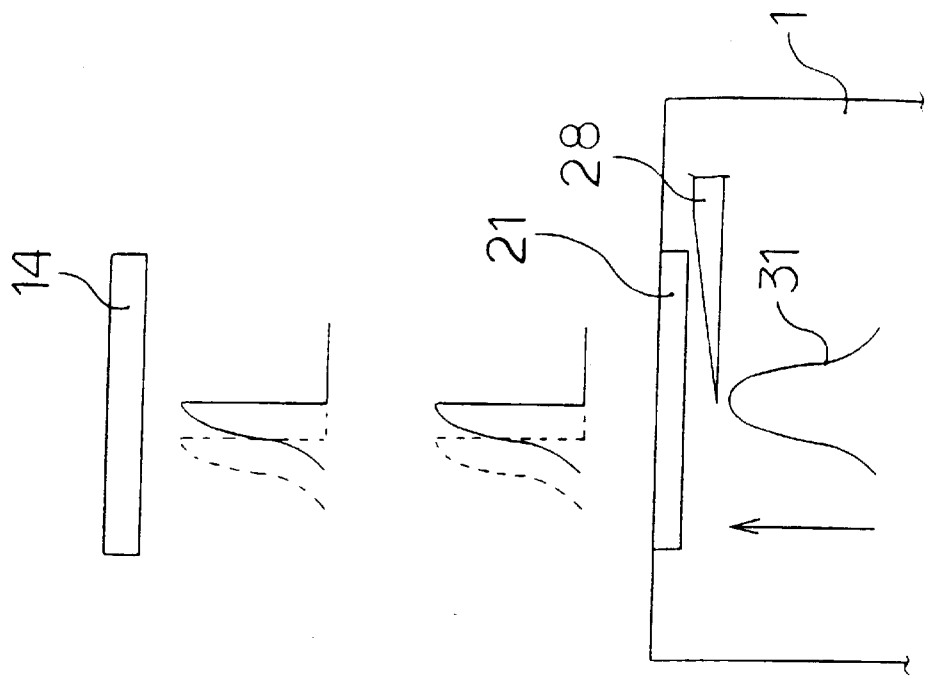
FIGS. 14A and 14B are outline views of effects caused by a shading plate.
Figure 14:
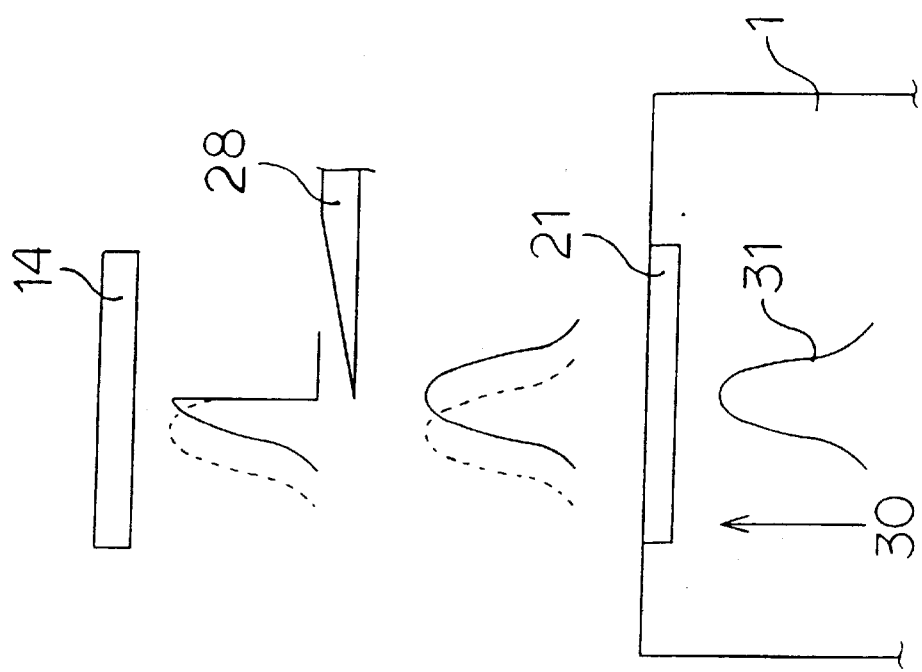
Figure 15:
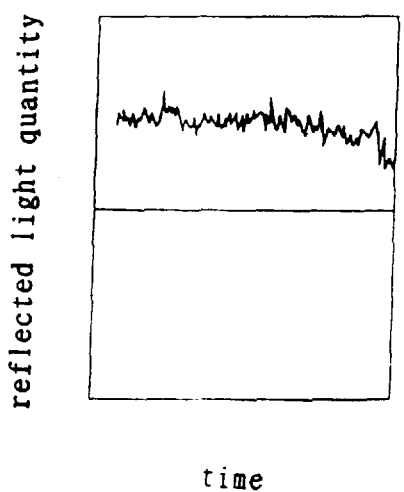
FIG. 15 is a graph of characteristics showing the change in reflected light quantity over time.

The outline is shown in FIG. 14 (B). This embodiment differs from FIG. 14 (A) in terms of shading plate 28 disposed inside film forming chamber 1. A part of light distribution 31 is obstructed by shading plate 28, but the light distribution does not change after being radiated through optical window 21 into the atmosphere. Thus, the light power which reaches detector 14 remains the same. As a result, a stable signal can be obtained even if the thickness was controlled at high temperature of 200° C.~360° C. This signal is shown in FIG. 15. FIG. 15 indicates that signal noise decreases considerably as compared with the signal shown in FIG. 13 (B).

EXAMPLE 7

Figure 16:
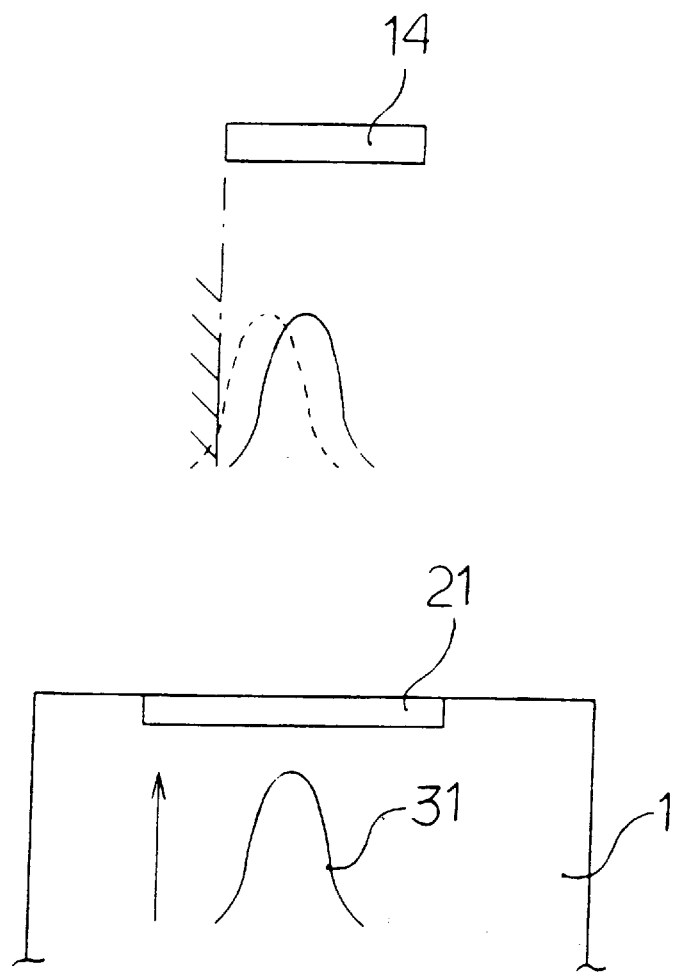
FIG. 16 is an outline view of influence caused by a temperature increase.

It was explained in the above-noted sixth embodiment that the light was obstructed inside film forming chamber 1 so that the light power entering detector 14 changed less. Indeed, the above-noted embodiment reduced noise considerably but not completely. It is shown in FIG. 16 that air present above optical window 21 swings due to temperature. The distribution of light radiated from film forming chamber 1 does not change, but the optical path is distorted and shifted from the optical path of the unbroken line to the path of the dotted line. When this kind of swing occurs, a bottom part of the light distribution is considered to protrude from an area where detector 14 has sensitivity. Accordingly, the seventh embodiment of the invention was figured out to reduce more noise by controlling the swing of the optical path itself.

Figure 17A:
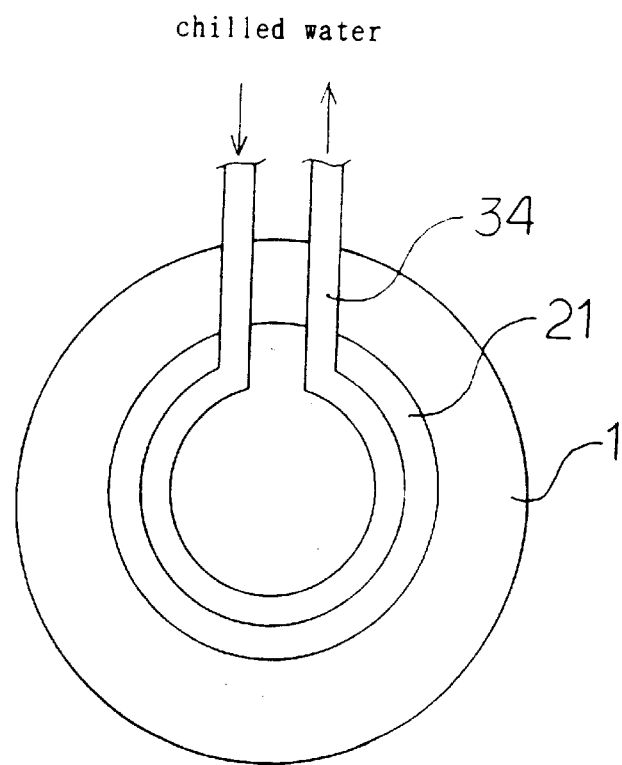
FIGS. 17A and 17B are outline views of a cooling means.
Figure 17B:
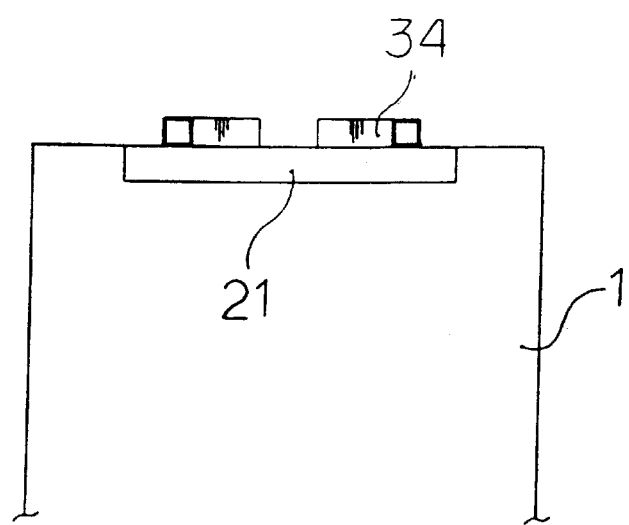

The outline is shown in FIG. 17. FIG. 17 (A) and 17 (B) show that cooling pipe 34 is disposed in the atmosphere on the surface of optical window 21 which is present inside film forming chamber 1 where no light passes. Cooling water circulates in cooling pipe 34, thereby cooling the surface of optical window 21, and preventing the air above optical window 21 from swinging. It is also possible to dispose cooling pipe 34 on the inside surface of film forming chamber 1.

Figure 18:
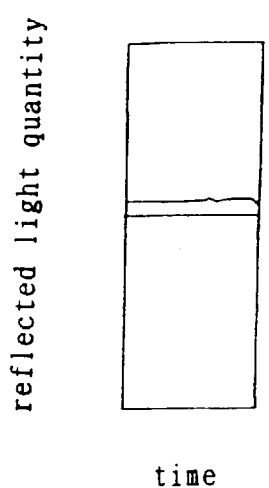
FIG. 18 is a graph of characteristics showing the change in reflected light quantity over time.

When the surface temperature of optical window 21 was measured, it had been cooled to about 80° C. by only letting 20° C. cooling water run. Signal noise was almost completely gone. This signal is shown in FIG. 18. FIG. 18 indicates that the signal noise decreased considerably as compared with the signal shown in FIG. 15. Therefore, it is actually useful to use a film forming apparatus which can cool optical window 21 as in the seventh embodiment of the invention for forming a film at the high temperature of 200°~360° C. This is because the optical thickness can be precisely controlled while observing the multilayer film during the film forming process in vacuum. It is preferable that the surface temperature of optical window 21 is less than 70° C. Although there is no lower limit as to the surface temperature, the preferable temperature is about 20° C.

EXAMPLE 8

An evaporation of a layer was completed by using an apparatus shown in the second embodiment, and spectral characteristics of the multilayer film were measured. It became clear that a measurement accuracy deteriorates when a certain optical thickness monitoring substrate was used.

It became clear through investigation that the parallelization degree of the optical thickness monitoring substrate was poor, and the light reflected from multilayer film monitoring substrate 17 was distorted by this inclination. As a result, the distribution of light reaching the detector changed.

Based on this fact, the eighth embodiment of the invention was figured out to improve the measurement accuracy by making the parallelization degree of optical thickness monitoring substrate 10 more accurate.

First of all, in order to examine how much parallelization degree is needed for the optical thickness monitoring substrate, an area of stable measurement was examined by moving the detector in a condition where the reflected light from multilayer film monitoring substrate 17 was kept constant. Based of this calculated quantity, an acceptable value in the parallelization degree of the optical thickness monitoring substrate was calculated in reverse operation.

The detector was continuously moved to measure the wavelength at half maximum of the light reflected from the multilayer film monitoring substrate.

Figure 19A:
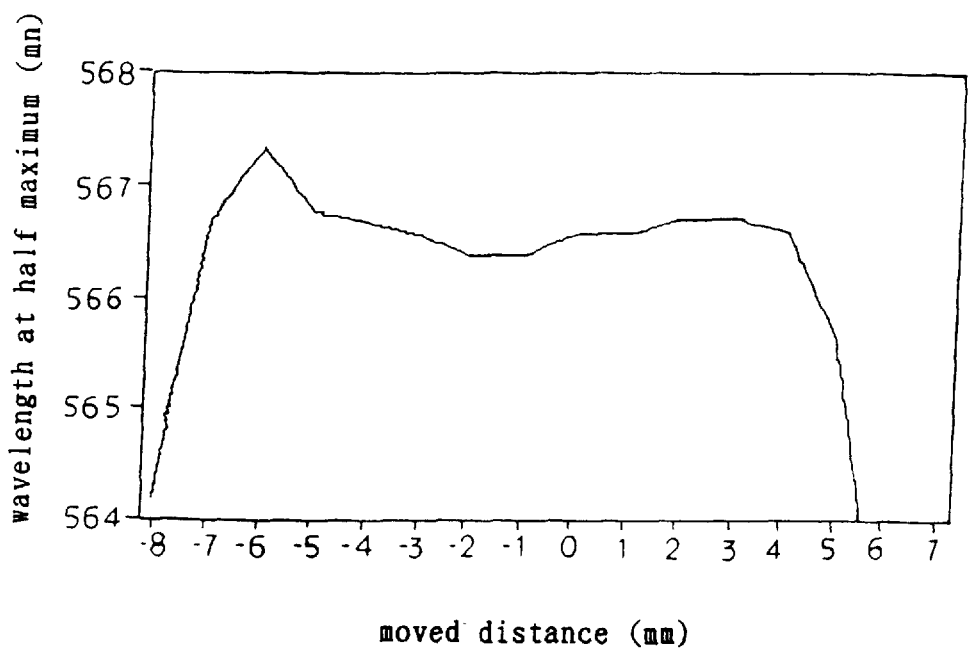
FIGS. 19A and 19B are graphs of characteristics showing the wavelength at half maximum and the change in light quantity against a moved distance of a detector.
Figure 19B:
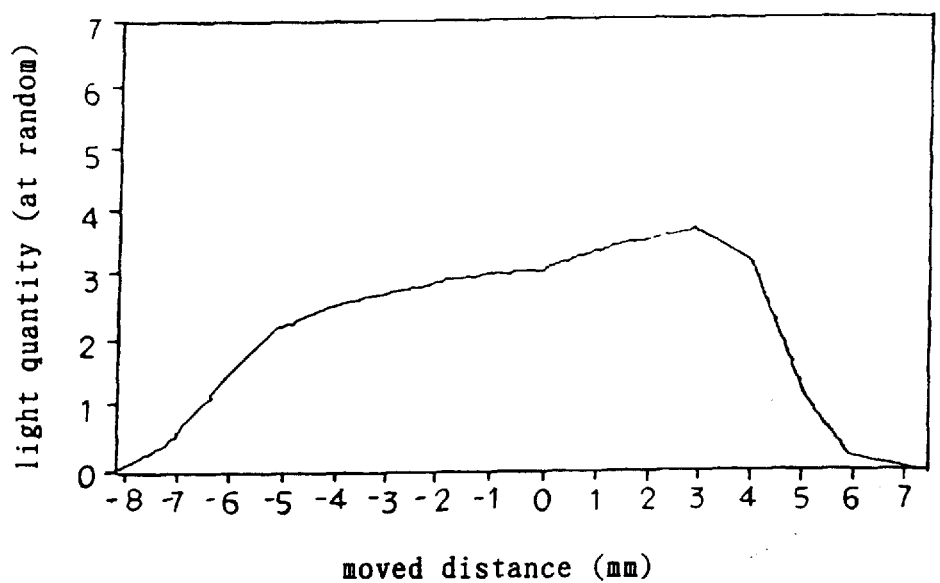

The relationship between the mobile distance and the wavelength at half maximum was examined and is shown in FIG. 19 (A). FIG. 19 (A) shows that the wavelength at half maximum increases after having a relatively small value in the beginning. Then the value becomes extremely stable. After that, the value falls again. It became clear that the area where the wavelength at half maximum can be measured stably ranges ±3 mm and the measured value differs for several nm outside this area. As a result, the measurement accuracy deteriorates when the light reflected from the multilayer film monitoring substrate inclines due to the bad parallelization degree of the optical thickness monitoring substrate. This is due to the fact that the measurement was conducted at both sides of FIG. 19 (A) where the accuracy of the wavelength at half maximum shows instability.

Generally, an optical thickness monitor of an optical system is disposed one m away from a detector to control optical thickness, and two mirrors are present between the two. A gap in optical path of ±3 mm is created in a position of the detector when the optical thickness monitor inclines in the range of ±10 minutes. Therefore, it is possible to measure spectral characteristics of a multilayer film with higher accuracy by using optical thickness monitoring substrate 10 having a parallelization degree within the limit of ±10 minutes. Actually, the accuracy of measurement reproduction was evaluated by using an optical thickness monitoring substrate having a parallelization degree of less than 10 minutes A good result of less than ±0.2 nm was obtained.

EXAMPLE 9

The above-noted eighth embodiment of the invention showed that spectral characteristics of a multilayer film can be measured with high accuracy by limiting the parallelization degree of optical thickness monitoring substrate 10. In the nineth embodiment of the invention, another measuring method is used to conduct more accurate measurements.

Figure 20A:
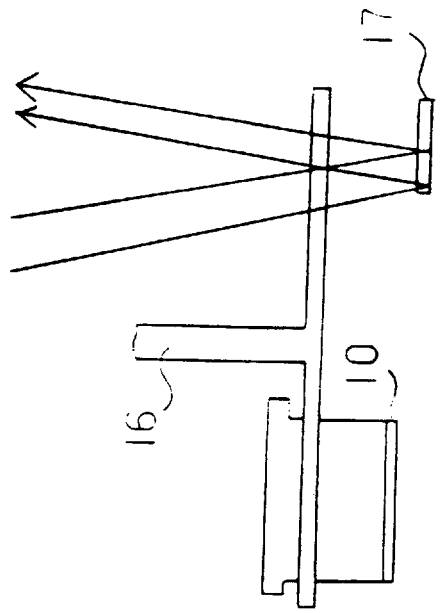
FIGS. 20A and 20B are outline views of a method to measure spectral characteristics in a multilayer film.
Figure 20B:
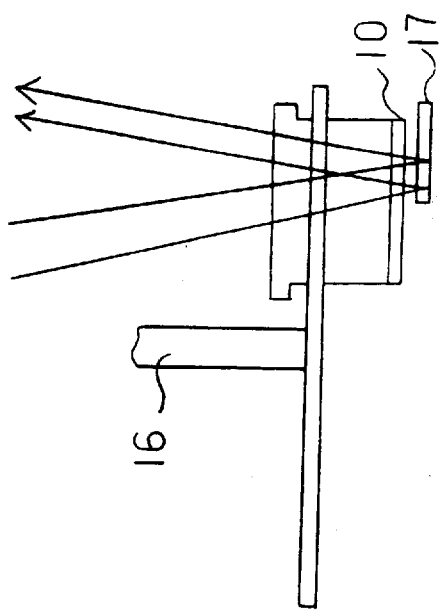

FIG. 20 (A) shows a relative position of optical thickness monitoring substrate 10 and multilayer film monitoring substrate 17 during and after an evaporation process. As shown here, multilayer film monitoring substrate 17 is located under optical thickness monitoring substrate 10 so that the light passing optical thickness monitoring substrate 10 reflects on multilayer film monitoring substrate 17 and passes optical thickness monitoring substrate 10 once again. Therefore, when the inclination of optical thickness monitoring substrate 10 changes, the optical path of the light is distorted. The following measuring method is used to diminish this influence.

Spectral characteristics of a multilayer film will not be measured in a state when the evaporation process is over, as described in FIG. 20 (A). As soon as optical thickness monitoring substrate 10 moves to another place by monitor exchange system 16, a state is created in which the optical thickness monitoring substrate is not present above multilayer film monitoring substrate 17. The spectral characteristics of the multilayer film will be measured in this so-called "through" state (FIG. 20 (B)). This extremely simple method can create a state in which optical thickness monitoring substrate 10 has no influence. As soon as the spectral characteristics of the multilayer film are measured, optical thickness monitoring substrate 10 for the next layer is disposed, and the evaporation process of the next layer starts.

By using this measuring method, a very accurate and excellent measurement can be conducted because the influence of optical thickness monitoring substrate 10, such as parallelization degree, is not present. In a concrete experiment examining measurement reproducibility, excellent results of less than ±0.2 nm were attained.

EXAMPLE 10

An apparatus shown in the above-noted second embodiment was used to measure spectral characteristics of a multilayer film. It became clear that when a filament in light source 11 was off and replaced, the intercepted light quantity measured at detector 14 fell radically. In some cases, the measurement accuracy of the spectral characteristics of the multilayer film deteriorated.

It became clear through investigation that light source 11 moved slightly causing the optical path of light to create a gap. As a result, the measurement was not conducted completely in the stable measurement area. Since it is actually difficult to set the position of light source 11 with high accuracy, the tenth embodiment of the invention was figured out to diminish the influence of changing light source positions by adjusting the light-intercepting position to an area where stable measurement can be conducted.

A detector was continuously moved in a horizontal direction to measure the quantity of light reflected from the multilayer film monitoring substrate. FIG. 19 (B) shows the relationship between the moved distance and the light quantity. FIG. 19 (B) shows that the intercepted light quantity increases with the movement of the detector. It reaches a maximum quantity in a specific position and falls rapidly after that. When this relationship is compared with the relationship between the moved distance and the wavelength at half maximum in FIG. 19 (A), it is better to adjust the position of the detector to a somewhat shifted position from the maximum value rather than to adjust it to the maximum value because the central position of the area where the wavelength at half maximum can be stably measured does not accord with the position where the intercepted light quantity reaches its maximum. Furthermore, it is preferable that the position is shifted from this value for 2~8 mm.

This is due to the fact that the light, reshaped by the optical lens, and the area which is measured by the detector are circular, whereas multilayer film monitoring substrate 17 has a semicircular shape so that a polarization phenomenon is caused as its multiplier effect. Therefore, the polarization can be corrected when both have the same shape, but it could be inconvenient to use the same shape from a practical standpoint.

However, this is extremely useful according to the invention since it is possible to measure more accurately by only shifting the position of measurement. Generally, a dimension of about 2 cm is usually used as a dimension of light reshaped by an optical lens, as an area measured by a detector, or as a size of the multilayer film monitoring substrate. In this instance, a highly accurate measurement can be attained by shifting the position for 2~8 mm, as shown in the tenth embodiment. Therefore, when the optical path changed due to an exchange of the light source, the detector which intercepts the light reflected from the multilayer film monitoring substrate is moved to a position where the intercepted light reaches the maximum value. The spectral characteristics of the multilayer film can be measured with extremely high accuracy when the detector is located 2~8 mm away from this maximum position.

EXAMPLE 11

An apparatus shown in the above-noted second embodiment was used to measure spectral characteristics of a multilayer film. It became clear that when an optical thickness monitoring substrate was replaced by means of a monitor exchange system, light quantity detected as light reflected from a multilayer film monitoring substrate fell radically. Sometimes, the measurement accuracy deteriorated remarkably.

Figure 21A:
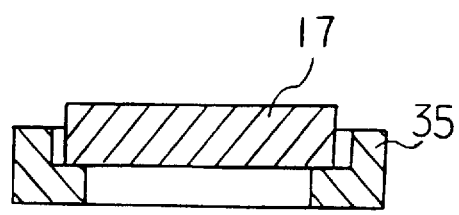
FIGS. 21A and 21B are outline views of a means to fix a multilayer film monitoring substrate.
Figure 21B:
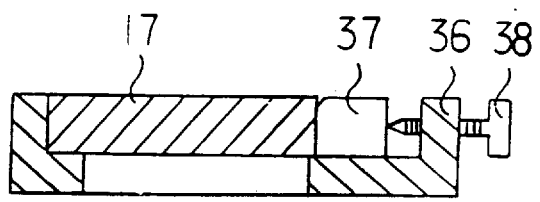
Figure 22:
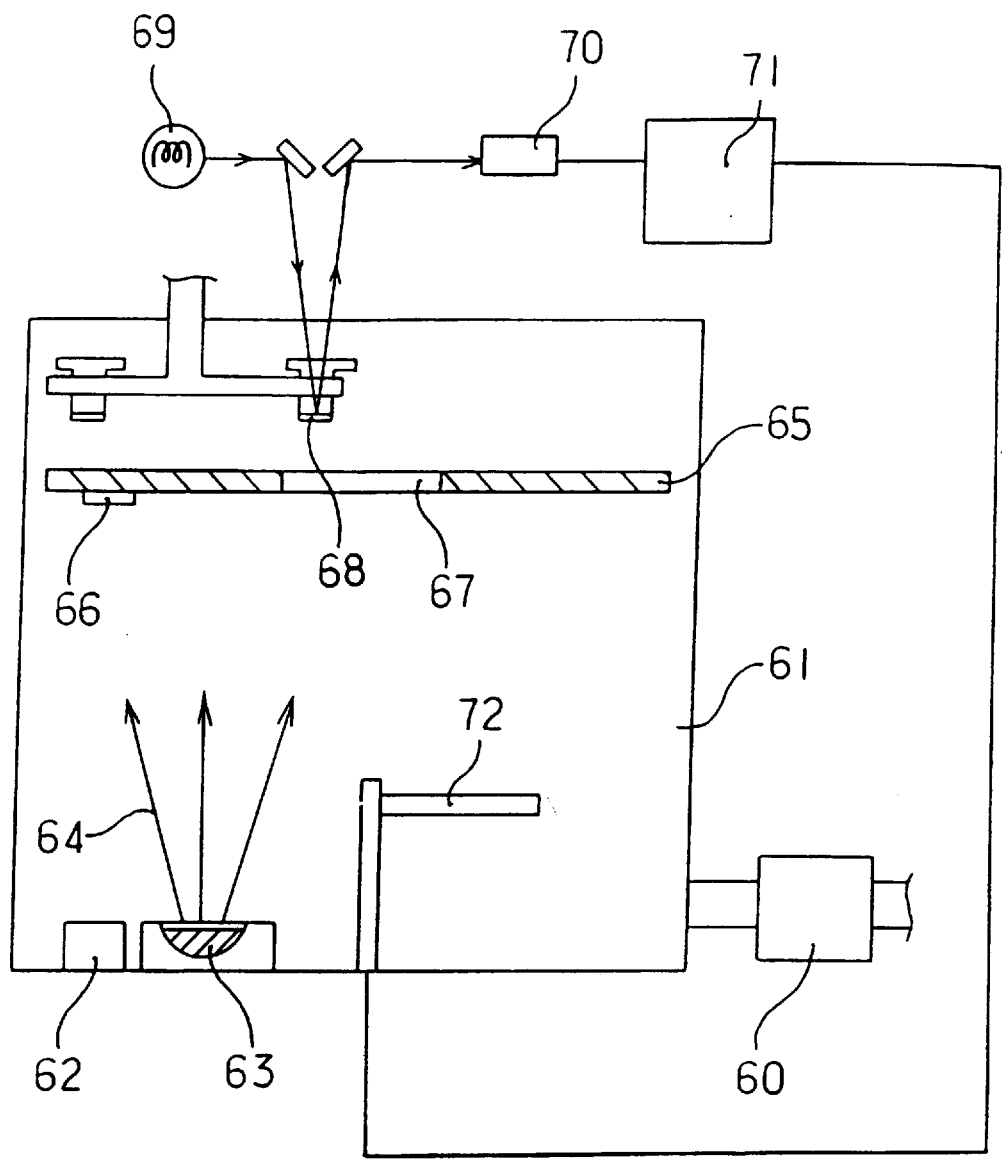
FIG. 22 is a cross-sectional view of a main part showing the conventional film forming apparatus.

It became clear through investigation that this was due to the following. Generally, holding jig 35 is used to hold multilayer film monitoring substrate 17, as shown in FIG. 21 (A). Multilayer film monitoring substrate 17 is only placed on a substrate holding part of holding jig 35 so that holding jig 35 moves slightly when the optical thickness monitoring substrate is replaced. This subtle vibration travels to multilayer film monitoring substrate 17 causing multilayer film monitoring substrate 17 to incline more than ten minutes. Thus, the optical path of the reflected light is distorted.

Further investigation made clear that when light quantity reaching the detector changes due to the distorted light path, since an optical lens which is used for leading the light from the light source into the multilayer film monitoring substrate has a chromatic aberration, the components of the chromatic aberration affect the spectral measurement of the multilayer film badly. This causes the measurement accuracy to deteriorate more.

Based on this fact, the eleventh embodiment of the invention was figured out to improve the measurement accuracy by using an achromatic lens as the optical lens which controls the components of chromatic aberration and by fixing the multilayer film monitoring substrate somehow to the holding jig.

One embodiment of fixing the multilayer film monitoring substrate is shown in FIG. 21 (B). This example differs from FIG. 21 (A) of prior art in adding keep plate 37 and cap screw 38. Keep plate 37 is disposed on top of holding jig 36. Multilayer film monitoring substrate 17 is pressed and fixed to the side face of holding jig 36 by cap screw 38. This relatively simple method enables the multilayer film substrate to be fixed, so that an accurate measurement can be attained. In an experiment, the optical thickness monitoring substrate was replaced in a state in which a multilayer film monitoring substrate was fixed to a holding jig. The measurement accuracy did not deteriorate at all. The eleventh embodiment referred to a method of fixing a multilayer film monitoring substrate by disposing a keep plate newly. However, the fixing method is not limited to this particular method.

EXAMPLE 12

In the above-noted first embodiment of the invention, a method was explained in which the quantity gap in optical characteristics was adjusted by conducting an optimizing calculation of the refraction index and the thickness of the remaining layers by means of the DLS method used for designing lenses.

However, when the DLS method is actually used for calculation, a great amount of time is sometimes needed to calculate one adjustment because it is necessary to conduct a convergence calculation many times. It also became clear that excellent results are not always obtained because a convergence did not take place. This will be a major problem for the multilayer film forming process. In particular, this will be a major practical obstacle for full automation.

Investigations were made to construct a useful system in practice without using the above-noted method of reducing the quantity gap through optimizing convergence calculation of the refraction index and the thickness of the remaining layers. A new conception was to use the quantity gap directly for an adjustment formula in order to determine and adjust thickness etc. of the next layer. If this was possible, not only could the calculation time be reduced, but a personal computer could also be used as a calculator. In addition, it would be easier to attain full automation.

As a result, it was possible to obtain excellent results through an adjustment formula without conducting the optimizing convergence calculation. Accordingly, a film forming method of the twelveth embodiment was figured out. In the following, a method is explained by using an apparatus shown in the second embodiment in which a green reflective film comprising nineteen layers is formed through the adjustment formula shown in FIG. 3.

A multilayer film is formed up to the tenth layer and spectral characteristics at this point were measured. After that, a quantity gap with predetermined target characteristics was obtained. It is possible to use transmissivity, reflectance of single wavelength, wavelength at half maximum or maximum reflectance etc. of the multilayer film as the quantity gap, but wavelength at half maximum was used in this case. This is due to the fact that the wavelength at half maximum functions as a key parameter for optical performance of the multilayer film. At the same time, an experiment showed that an accurate measurement can be conducted even if the maximum quantity of reflected light changed due to the delicate measurement conditions, because the wavelength at half maximum is the wavelength of half the maximum quantity of reflected light.

Assuming that the wavelength at half maximum on the shortwave side of the targeted green reflective film is 518 nm, the wavelength at half maximum on the long-wave side is 642 nm, the wavelength at half maximum on the measured short-wave side is 520 nm, and the wavelength at half maximum on the long-wave side is 644 nm, the quantity gap on the short-wave side will be 2 nm and 2 nm on the long-wave side. In order to adjust the quantity gap of the wavelength at half maximum, e.g. the following formula is used to determine the adjustment thickness:

$K_s$=−(quantity gap on the short-wave side+quantity gap on the long-wave side)/100×3+1

The adjustment quantity can be determined by using this formula since the next eleventh layer of forming $SiO_2$ is now in turn. According to this formula, $K_s$ will be 0.88. Therefore, the next layer is formed with a target value of the optical thickness which is obtained by multiplying the predetermined thickness by 0.88. This formula is used for forming $SiO_2$ hereafter.

In the next step, when the evaporation of $SiO_2$ is completed with the adjusted optical thickness, spectral characteristics of the multilayer film monitoring substrate are measured again. In this way, a quantity gap of the wavelength at half maximum on the short-wave side and a quantity gap of the wavelength at half maximum on the long-wave side of the green reflective film are obtained at the stage of forming the eleventh layer.

Then, an adjustment coefficient $K_t$ is obtained according to the following formula:

$K_t$=−(quantity gap on the short-wave side+quantity gap on the long-wave side)/4/100×3+1

The next layer is formed with the adjustment thickness which is obtained by multiplying the predetermined thickness by this value. This formula is used for forming the material $TiO_2$ hereafter.

As described above, when a material comprising the next layer is $SiO_2$, $K_s$ is obtained as the adjustment coefficient while $K_t$ is obtained as the adjustment coefficient for $TiO_2$. In this way, adjustment of thicknesses is obtained by multiplying the adjustment coefficient by the predetermined thickness of the next layer, and each layer is formed with this optical thickness as its new target until the end of nineteenth layer.

According to an experiment, there was a wavelength gap at half maximum of ±3.2 nm against the target value at the stage of forming the nineteenth layer when an adjustment was not conducted. However, when this adjustment was conducted, the wavelength gap at half maximum was less than ±1.5 nm which is very close to the target value. It became clear that the target characteristics can be approximately obtained by the adjustment. It became clear that excellent results can be obtained through an adjustment formula of a function comprising this kind of quantity gap in a wavelength at half maximum and constant. As a result, this adjustment method proves to be extremely useful since a simple adjustment formula can achieve extremely good results.

EXAMPLE 13

In the above-noted twelfth embodiment, it became clear that the method is very useful since it can achieve targeted optical characteristics by using a simple adjustment formula. In case of the green reflective film shown in FIG. 3, however, more than 10% of the ripple in the light transmitting wavelength area can not meet the needs of various optical devices. Thus, a green reflective film with less ripple is required.

In order to obtain this kind of green reflective film, it is known that the ripple can be reduced by changing the thickness of a specific layer, not by making the thicknesses of each layer identical. The adjustment formula shown in the above-noted twelveth embodiment was used in a film in which the thickness of a specific layer had been changed. It became clear that the characteristics are adjusted approximately to the target value in most cases, but a gap of a few nm against the target value appeared occasionally.

It became clear through investigation that the adjustment formula of the above-noted twelveth embodiment had limited effects. In other words, when the thickness of each layer comprising the multilayer film drifts from the target value in the middle of film forming process, the wavelength gap at half maximum is affected differently when the number of layer differs, even if the thickness is the same.

Therefore, the adjustment quantity should not be obtained by multiplying the wavelength gap at half maximum by the constant. An adjustment formula of the thirteenth embodiment was figured out to improve performance by multiplying a weight coefficient that takes into account the degree of influence that the thickness error of each layer gives according to the number of layers on the wavelength at half maximum. The following formula is used for forming $SiO_2$:

$K_s$=−(quantity gap on the long-wave side−quantity gap on the short-wave side)×number of the next layer/number of all layers×4/100+1

In this formula, an adjustment is conducted by a method in which the degree of influence which is given on the wavelength gap at at half maximum according to the number of layers. In other words, a weighting method is used in the term "number of the next layer/number of all layers". This $K_s$ is multiplied by the predetermined optical thickness of the next layer and this value will be the target value for forming the film.

The following formula is used to obtain the optical thickness with which $TiO_2$ will be formed:

$K_t$=−quantity gap on the short-wave side/100+1.0

In this way, $K_t$, which is obtained through the above formula, is multiplied by the optical thickness value of the following layer. This value will be the target value for forming the film. In this instance, weight was not given according to the number of layers, but the weighting by $SiO_2$ was effective enough. It is naturally anticipated that more effects can be attained through the weighting.

An experiment was conducted according to this adjustment method. As a result, by conducting this adjustment, a nineteen layer film having very little ripple was formed completely in which the wavelength gap at half maximum against the target value was less than ±1.5 nm of the target characteristics. In this instance, it was explained with reference to a green reflective film comprising of nineteen layers. It goes without saying that the invention is not affected by this specific film structure. Excellent results can be obtained when the most suitable adjustment formula is used according to each film structure.

EXAMPLE 14

In the above-noted method of the first embodiment, a multilayer film was formed while controlling the optical thickness and the predetermined optical thickness of the remaining layers were changed when the optical characteristics of the multilayer film drifted from the target value in the middle of film forming process. In this way, the targeted optical characteristics were obtained when the last layer was formed. However, when an optical thickness error occurred in the last layer, it was very difficult to obtain a multilayer film which has closer characteristics to the target characteristics since there is no layer left to fix this error.

In order to solve this problem, the fourteenth embodiment of the invention was figured out in which a simple method is used to obtain a multilayer film which has closer characteristics to the targeted values. In the following, an example of forming a multilayer film comprising of nineteen layers is explained.

As in the above-noted first embodiment, the thicknesses are adjusted by using an apparatus shown in FIG. 1 and eighteen layers are completed. In the first embodiment mentioned above, spectral characteristics of a multilayer film formed on a multilayer film monitoring substrate are measured and a quantity gap against the target characteristics is obtained. Then, in the next and last layer, the optical thickness is obtained to adjust this gap, and this optical thickness will be the target for forming the film. On the other hand, in the fourteenth embodiment of the invention, this optical thickness will not be the target. Optical characteristics of a multilayer film formed on the multilayer film monitoring substrate are observed constantly during the film forming process, and the process is completed at the moment the optical characteristics approached the target characteristics without taking the value of the optical thickness into account.

Therefore, it is possible to obtain a multilayer film having extremely close optical characteristics as targeted without being affected by the optical thickness error in the last layer. An actual experiment was conducted using a green reflective film comprising of nineteen layers. An excellent multilayer film was obtained in which the wavelength gap at half maximum was less than 1 nm against the target characteristics.

In this instance, there is no limit of items comparing the optical characteristics and the target characteristics of the multilayer film monitoring substrate. However, it takes time to compare the measured and the target values of the optical characteristics in all wavelengthes so that it is preferable to observe the transmissivity or the reflectance of relatively important wavelengthes. By comparing and controlling these values, excellent optical characteristics can be obtained. Although it was explained in the fourteenth embodiment of the invention that the method was used to form the film by observing the optical characteristics of the last layer, the invention is not limited to this method. For example, when characteristics of a certain wavelength in the tenth layer are important, a film can be formed while observing the optical characteristics of the multilayer film in this specific layer.

We claim:

1. A multilayer film forming method, comprising the steps of:

(a) measuring spectral characteristics of an L-layer film formed on a multilayer film monitoring substrate, when a multilayer film is formed up to the L-layer, wherein the spectral characteristics are measured as at least one value selected from the group consisting of a transmission index and a reflectance of a specific wavelength, (b) calculating a gap between the measured value and a target value wherein said gap is a wavelength gap at half maximum calculated in accordance with the formula Gap=(Target value)−(Measured wavelength at half maximum value);

(c) recalculating at least one quantity selected from the group consisting of a thickness and an index of refraction of the film following the L-layer in order to reduce the gap by changing a predetermined value, (d) feeding at least one quantity selected from the group consisting of said thickness and said refraction index of an L+1 film obtained through said calculation process back to at least one quantity selected from the group consisting of a thickness controlling means and a refraction index controlling means to form the L+1 layer, and calculating at least one value selected from the group consisting of said thickness and said refraction index of said L+1 layer by means of a predetermined adjustment formula based on said gap.

2. A multilayer film forming method as claimed in claim 1 wherein said adjustment formula is the product of said wavelength gap at half maximum and a constant.

3. A multilayer film forming method as claimed in claim 1, wherein said adjustment formula is the product of said wavelength gap at half maximum and a coefficient weighted to each layer.

4. A multilayer film forming method as claimed in claim 1, further comprising forming a film while observing a transmission index or a reflectance of a specific wavelength of said spectral characteristics.

5. A multilayer film forming method as claimed in claim 1 further comprising irradiating a light beam onto an optical thickness monitoring substrate having a decree of parallelization more than zero minutes and less than ten minutes and onto a multilayer film monitoring substrate disposed below, separating said beam into a first beam which is at least one of a reflected or transmitted beam at said optical thickness monitoring substrate and a second beam which is at least one of a reflected or transmitted beam at said multilayer film monitoring substrate, using said first beam to measure a reflected and transmitted light quantity, and using said second beam to measure said spectral characteristics of said multilayer film.

6. A multilayer film forming method as claimed in claim 1, further comprising irradiating a beam onto a optical thickness monitoring substrate and a multilayer film monitoring substrate disposed below, separating said beam into a first beam which is at least one of a reflected or transmitted beam at said optical thickness monitoring substrate and a second beam which is at least one of a reflected or transmitted beam at said multilayer film monitoring substrate, using said first beam to measure a reflected and transmitted light quantity, and using said second beam to measure said spectral characteristics of said multilayer film in a condition wherein said optical thickness monitoring substrate disposed on said multilayer film monitoring substrate is chanced so that optical thickness monitoring substrate is not present on said multilayer film monitoring substrate.

7. A multilayer film forming method, comprising the steps of:

(a) forming a multilayer film until a thickness or an optical thickness of a specific layer reaches a predetermined value, (b) forming remaining layers while measuring spectral characteristics of said multilayer film until said spectral characteristics become predetermined spectral characteristics.

8. A multilayer film forming method as claimed in claim 7, wherein a multilayer film consisting of N-layers is formed by forming the first layer to the N−1 layer until a thickness or an optical thickness of each layer reaches predetermined value and forming said N-layer while measuring said spectral characteristics of said multilayer film until said spectral characteristics become predetermined spectral characteristics.

9. A multilayer film forming method as claimed in claim 7, further comprising irradiating a light beam to an optical thickness monitoring substrate having less than ten minutes of parallelization degree and to a multilayer film monitoring substrate disposed below, separating said beam into a first beam which is either reflected or transmitted at said optical thickness monitoring substrate and a second beam which is either reflected or transmitted at said multilayer film monitoring substrate, using said first beam to measure reflected or transmitted light quantity, and using said second beam to measure said spectral characteristics of said multilayer film.

10. A multilayer film forming method as claimed in claim 7, further comprising irradiating a beam to an optical thickness monitoring substrate and a multilayer film monitoring substrate disposed below, separating said beam into a first beam which is either reflected or transmitted at said optical thickness monitoring substrate and a second beam which is either reflected or transmitted at said multilayer film monitoring substrate, using said first beam to measure reflected or transmitted light quantity, using said second beam to measure said spectral characteristics of said multilayer film in a condition where said optical thickness monitoring substrate disposed on said multilayer film monitoring substrate is moved so that said optical thickness monitoring substrate is not present on said multilayer film monitoring substrate.

11. A multilayer film forming method as claimed in claims 5, 6, 9, 10, wherein said spectral characteristics of said multilayer film are measured by intercepting said second beam in a position where intercepted light quantity is not at a maximum value.

12. A multilayer film forming method as claimed in claim 7, wherein said second beam is intercepted 2~8 mm away from a position where said intercepted light quantity reaches its maximum.

* * * * *